US011579166B1

(12) United States Patent
Senkal et al.

(10) Patent No.: US 11,579,166 B1
(45) Date of Patent: Feb. 14, 2023

(54) RESONANT ACCELEROMETER

(71) Applicant: Meta Platforms Technologies, LLC, Menlo Park, CA (US)

(72) Inventors: Doruk Senkal, Kirkland, WA (US); Yuri Toride, Redmond, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 0 days.

(21) Appl. No.: 17/698,439

(22) Filed: Mar. 18, 2022

Related U.S. Application Data

(63) Continuation of application No. 16/908,560, filed on Jun. 22, 2020, now Pat. No. 11,307,217.

(60) Provisional application No. 62/864,952, filed on Jun. 21, 2019.

(51) Int. Cl.
  *G01P 15/13* (2006.01)
  *B81B 3/00* (2006.01)
  *G01P 15/097* (2006.01)
  *G01P 15/08* (2006.01)

(52) U.S. Cl.
  CPC ............ *G01P 15/13* (2013.01); *B81B 3/0018* (2013.01); *G01P 15/0975* (2013.01); *B81B 2201/0235* (2013.01); *G01P 2015/0862* (2013.01)

(58) Field of Classification Search
  CPC ................. G01P 15/13; G01P 15/0975; G01P 2015/0862; B81B 3/0018; B81B 2201/0235
  See application file for complete search history.

(56) References Cited

U.S. PATENT DOCUMENTS

| | | |
|---|---|---|
| 5,635,639 A | 6/1997 | Greiff et al. |
| 5,783,973 A | 7/1998 | Weinberg et al. |
| 6,196,067 B1 | 3/2001 | Martin et al. |
| 9,310,391 B2 | 4/2016 | Seshia et al. |
| 9,551,728 B2 | 1/2017 | Krylov et al. |
| 10,131,533 B1 | 11/2018 | Tsai et al. |
| 10,352,960 B1 | 7/2019 | Shcheglov et al. |
| 2005/0150297 A1 | 7/2005 | Ayazi et al. |

(Continued)

OTHER PUBLICATIONS

Non-Final Office Action dated Sep. 1, 2021 for U.S. Appl. No. 16/908,560, filed Jun. 22, 2020, 16 Pages.

(Continued)

*Primary Examiner* — Xin Y Zhong
(74) *Attorney, Agent, or Firm* — Weaver Austin Villeneuve & Sampson LLP

(57) ABSTRACT

In certain embodiments, an accelerometer is a microelectromechanical systems (MEMS) device including a proof mass, an anchor located in an opening defined by a body of the proof mass, a spring, a drive electrode, and a sense beam. The spring and the proof mass form a spring system suspended from the anchor. The sense beam oscillates at a particular resonance frequency based on application of a signal to the drive electrode. The MEMS device further includes a support structure coupled to the anchor. The support structure operates as a stress decoupling area and includes a support beam, with the spring corresponding to an end of the support beam that has a reduced thickness. The sense beam has a first end attached to the proof mass and a second end attached to the support beam such that the sense beam is orthogonal to the support beam.

20 Claims, 19 Drawing Sheets

(56) References Cited

U.S. PATENT DOCUMENTS

| | | | |
|---|---|---|---|
| 2012/0210792 A1* | 8/2012 | Robert | G01P 15/123 216/13 |
| 2014/0197898 A1 | 7/2014 | Hsu et al. | |
| 2015/0226762 A1 | 8/2015 | Seshia et al. | |
| 2016/0139171 A1* | 5/2016 | Becka | G01P 15/0802 216/41 |
| 2017/0191830 A1* | 7/2017 | Maeda | G01C 19/5776 |
| 2020/0025790 A1 | 1/2020 | Reinke | |
| 2020/0025792 A1 | 1/2020 | Reinke | |

OTHER PUBLICATIONS

Non-Final Office Action dated Aug. 25, 2021 for U.S. Appl. No. 16/908,559, filed Jun. 22, 2020, 8 Pages.
Notice of Allowance dated Dec. 16, 2021 for U.S. Appl. No. 16/908,560, filed Jun. 22, 2020, 8 Pages.
Notice of Allowance dated Jan. 20, 2022 for U.S. Appl. No. 16/908,559, filed Jun. 22, 2020, 7 Pages.

\* cited by examiner

RESONANT ACCELEROMETER

CROSS-REFERENCE TO RELATED APPLICATIONS

This application is a continuation of U.S. application Ser. No. 16/908,560, filed Jun. 22, 2020, entitled "RESONANT ACCELEROMETER", which claims the benefit of and priority to U.S. Provisional Application No. 62/864,952, filed Jun. 21, 2019, entitled "RESONANT ACCELEROMETER," the contents of which are herein incorporated by reference in their entireties for all purposes.

BACKGROUND

Accelerometers are often constructed using microelectromechanical systems (MEMS) components. Because MEMS components are relatively small and fragile, MEMS based devices usually need to be kept isolated from external influences, such as unwanted mechanical forces and temperature fluctuations. Such external influences can cause stress to be applied to the MEMS components. For example, temperature fluctuations can be a source of thermal stress induced by thermal expansion mismatches between materials (e.g. silicon and plastic) used to form the MEMS components and/or structures around the MEMS components. Mechanical forces are a source of mechanical stress that is typically generated at a stationary boundary (e.g., an anchor). Packaged MEMS dies, which often include silicon and plastic, are highly sensitive to stress from such external sources, especially at the anchors.

Accelerometers are designed specifically to detect and measure acceleration forces. The presence of package stress and other forms of mechanical force besides the acceleration to be measured can adversely affect measurement accuracy. In some instances, components in a MEMS device are intentionally designed to be more robust, but at the cost of device performance. For example, many MEMS accelerometers employ a spring that is made stiffer than needed for the operation of the accelerometer, in order to prevent stiction during operation or to prevent damage during the device fabrication process. Increased stiffness reduces the sensitivity of the accelerometer.

SUMMARY

The present disclosure relates to resonant accelerometer designs with improved stability and accuracy compared to conventional resonant accelerometers. In certain embodiments, a resonant accelerometer includes a proof mass and at least one resonating element used to detect movement of the proof mass based on changes in the resonance frequency of the resonating element. In a MEMs based resonant accelerometer, one or more beams (referred to herein as sense beams) are driven to resonate at a certain frequency. One end of the sense beam can be attached to a proof mass which moves in response to acceleration, while the other end of the sense beam can be anchored by a substantially stationary anchor and/or support structure coupled to the anchor. The movement of the proof mass triggers a change in the resonance frequency of the beam. Acceleration can therefore be measured based on the change in frequency of the sense beam.

In certain embodiments, an improved resonant accelerometer design incorporates a novel set of features including one or more of the following: strain based sensing (which is more immune to package stress compared to, for example, measuring a capacitive gap), differential electrostatic transduction (for more accurate driving and/or sensing), a single attachment point or "neck" for the entire mechanical structure (which provides stress isolation), an anchor inside the area of the proof mass (which reduces the overall footprint of the device), and high rigidity due to the use of horizontal and vertical beams (which offers protection against stiction).

Also described herein are techniques for improving the accuracy of accelerometers by electrically controlling the stiffness of a spring system within an accelerometer. In particular, techniques are described herein for electrostatically and dynamically softening a spring system in a MEMS accelerometer in order to increase the sensitivity of the MEMS accelerometer. The spring stiffness control techniques described herein can be applied to a variety of accelerometer designs including, for example, quasi-static accelerometers and resonant (i.e., frequency modulated) accelerometers.

In a quasi-static accelerometer, a proof mass is attached to one end of a spring that is anchored at the other end. In the absence of acceleration, the proof mass remains substantially stationary. Acceleration causes the proof mass to oscillate via the spring. This displacement of the proof mass can be measured using, for example, one or more sense electrodes located at a distance away from the proof mass. As the proof mass moves, the distance between the proof mass and the one or more sense electrodes changes in proportion to the acceleration. If an electrical signal is applied to the proof mass, the change in distance can be measured as a capacitance. In contrast to resonant accelerometers, quasi-static accelerometers do not involve actively driving a resonating element. Quasi-static accelerometers detect capacitance changes caused by displacement of the proof mass rather than frequency changes.

In certain embodiments, the stiffness of the spring system within an accelerometer is softened by applying, using one or more electrodes that are additional to any sense electrodes in the accelerometer, an electrostatic tuning signal to create a negative contribution to the overall stiffness of the spring system. Softening the spring system in this manner increases the sensitivity of the accelerometer, which is beneficial in certain situations, such as during periods of infrequent changes in acceleration and/or periods in which the magnitude of the acceleration is below a certain threshold. However, softening the spring system has a tradeoff in that the full-scale range, and thus the magnitude of the highest measurable signal, is reduced. Accordingly, in certain embodiments, the stiffness of the spring system is dynamically controlled such that the spring system is softened or softened to a greater extent in situations where increased sensitivity is desirable (e.g., the situations mentioned above), and such that the spring system is not softened or softened to a lesser extent in situations where increased full-scale range is desirable (e.g., during periods of frequent changes in acceleration or high magnitude acceleration).

In certain embodiments, an accelerometer includes a support structure that couples a spring to one or more anchors. The support structure can operate as a single attachment point for the mechanical structure of the accelerometer (e.g., the spring in combination with a proof mass and a sense beam). In some embodiments, the support structure includes one or more folded segments. The folded segment(s) are configured to deform in response to stress at an anchor (e.g., stress from thermal, mechanical, or other external sources). The deformation absorbs the anchor stress. Further, in some embodiments, a support structure can incorporate one or more notches or cutouts that operate as a "choke point" for stress or stress gradients. The notches/cutouts prevent stress from propagating to the mechanical elements involved in sensing (e.g., the spring and, when the accelerometer is configured as a resonant accelerometer, a sense beam). Thus, the support structure can enhance package stress rejection, thereby improving overall sensor stability in the presence of varying environmental factors such as temperature and mechanical stress.

In certain embodiments, a MEMS device includes a proof mass, an anchor, a spring between the proof mass and the anchor, a drive electrode, and a sense beam. The anchor is located in an opening defined by a body of the proof mass. The spring and the proof mass form a spring system suspended from the anchor. The sense beam is configured to oscillate at a particular resonance frequency based on application of a signal to the drive electrode. The resonance frequency changes according to a force generated by the proof mass in response to acceleration, and the proof mass generates the force by pivoting about a point along the spring.

In certain embodiments, a system includes a proof mass, an anchor, a spring between the proof mass and the anchor, a drive electrode, a sense beam, and one or more processors. The anchor is located in an opening defined by a body of the proof mass. The spring and the proof mass form a spring system suspended from the anchor. The sense beam is configured to oscillate at a particular resonance frequency based on application of a signal to the drive electrode. The resonance frequency changes according to a force generated by the proof mass in response to acceleration, and the proof mass generates the force by pivoting about a point along the spring. The one or more processors are configured to generate the signal applied to the first drive electrode, and to calculate an acceleration value based on a signal indicating a change in the resonance frequency of the sense beam.

In certain embodiments, a method involves generating, by an electronic controller of an accelerometer, a signal applied to a drive electrode to cause a sense beam to oscillate at a particular resonance frequency. The resonance frequency changes according to a force generated by a proof mass in response to acceleration, and the proof mass generates the force by pivoting about a point along a spring. The spring is between the proof mass and an anchor that is located in an opening defined by a body of the proof mass. The spring and the proof mass form a spring system suspended from the anchor. The method further involves calculating, by the electronic controller, an acceleration value based on a signal indicating a change in the resonance frequency of the sense beam.

This summary is neither intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim. The foregoing, together with other features and examples, will be described in more detail below in the following specification, claims, and accompanying drawings.

BRIEF DESCRIPTION OF THE DRAWINGS

Illustrative embodiments are described in detail below with reference to the following figures.

Figure 1:
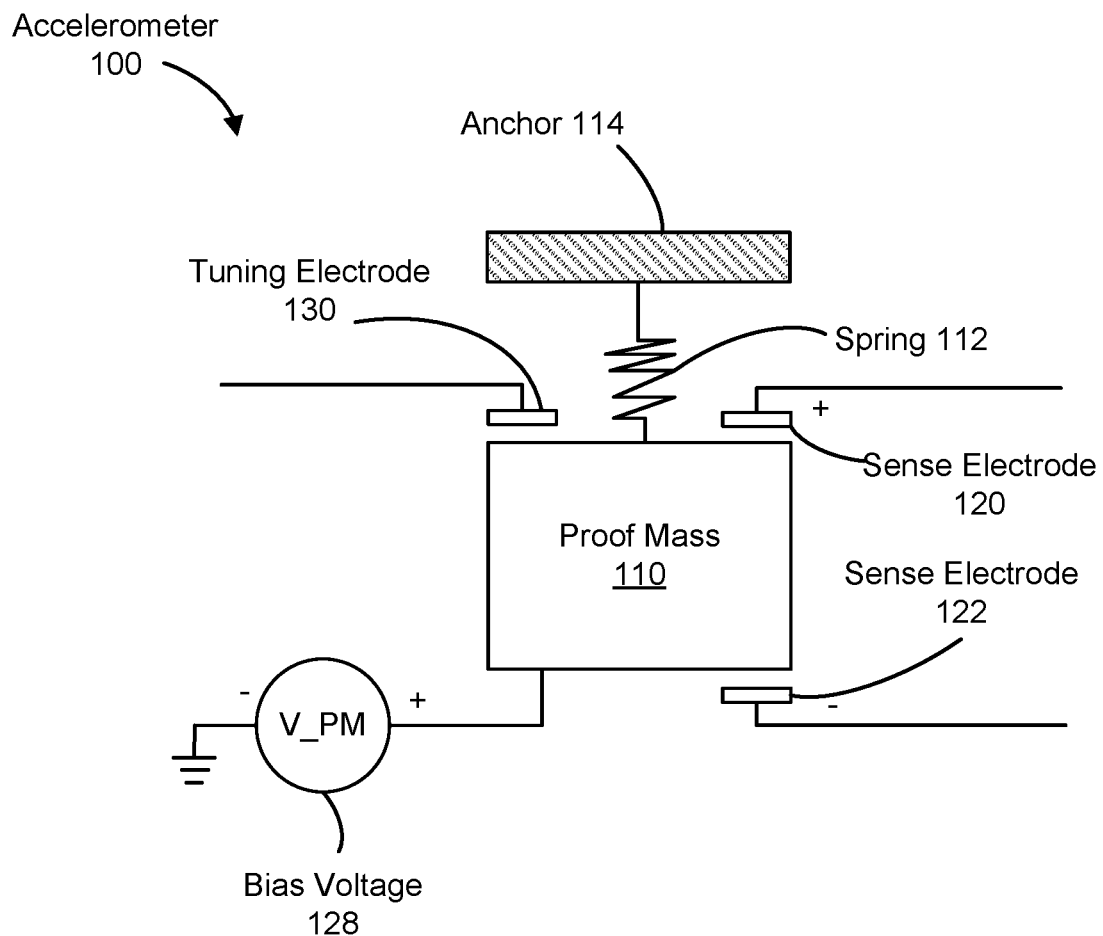
FIG. 1 is a conceptual diagram of a quasi-static accelerometer, according to certain embodiments.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

The present disclosure relates to resonant accelerometer designs with improved stability and accuracy compared to conventional resonant accelerometers. In certain embodiments, a resonant accelerometer includes a proof mass and at least one resonating element used to detect movement of the proof mass based on changes in the resonance frequency of the resonating element. In a MEMs based resonant accelerometer, one or more beams (referred to herein as sense beams) are driven to resonate at a certain frequency. One end of the sense beam can be attached to a proof mass which moves in response to acceleration, while the other end of the sense beam can be anchored by a substantially stationary anchor and/or support structure coupled to the anchor. The movement of the proof mass triggers a change in the resonance frequency of the beam. Acceleration can therefore be measured based on the change in frequency of the sense beam.

In certain embodiments, an improved resonant accelerometer design incorporates a novel set of features including one or more of the following: strain based sensing (which is more immune to package stress compared to, for example, measuring a capacitive gap), differential electrostatic transduction (for more accurate driving and/or sensing), a single attachment point or "neck" for the entire mechanical structure (which provides stress isolation), an anchor inside the area of the proof mass (which reduces the overall footprint of the device), and high rigidity due to the use of horizontal and vertical beams (which offers protection against stiction).

Also described herein are techniques for improving the accuracy of accelerometers by electrically controlling the stiffness of a spring system within an accelerometer. In particular, techniques are described herein for electrostatically and dynamically softening a spring system in a MEMS accelerometer in order to increase the sensitivity of the MEMS accelerometer. The spring stiffness control techniques described herein can be applied to a variety of accelerometer designs including, for example, quasi-static accelerometers and resonant (i.e., frequency modulated) accelerometers.

The example accelerometer designs and control techniques described herein may be used in conjunction with various technologies, such as an artificial reality system. An artificial reality system, such as a head-mounted display (HMD) or heads-up display (HUD) system, generally includes a display configured to present artificial images that depict objects in a virtual environment. The display may present virtual objects or combine images of real objects with virtual objects, as in virtual reality (VR), augmented reality (AR), or mixed reality (MR) applications. For example, in an AR system, a user may view both displayed images of virtual objects (e.g., computer-generated images (CGIs)) and the surrounding environment by, for example, seeing through transparent display glasses or lenses (often referred to as optical see-through) or viewing displayed images of the surrounding environment captured by a camera (often referred to as video see-through). In some AR systems, the artificial images may be presented to users using an LED-based display subsystem. In certain embodiments, an accelerometer as disclosed herein is used to implement an inertial measurement unit (IMU) within an artificial reality system (e.g., an IMU in an HMD).

In the following description, for the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples.

The figures and description are not intended to be restrictive. The terms and expressions that have been employed in this disclosure are used as terms of description and not of limitation, and there is no intention in the use of such terms and expressions of excluding any equivalents of the features shown and described or portions thereof. The word "example" is used herein to mean "serving as an example, instance, or illustration." Any embodiment or design described herein as "example" is not necessarily to be construed as preferred or advantageous over other embodiments or designs.

FIG. 1 is a conceptual diagram of a quasi-static accelerometer 100, according to certain embodiments. The accelerometer 100 includes a proof mass 110, a spring 112, a pair of sense electrodes 120, 122, and one or more tuning electrodes 130. The sense electrodes 120, 122 are located at a certain distance away from the proof mass 110 to form capacitive gaps and can be attached to separate anchors (not depicted). Thus, the sense electrodes 120, 122 operate as capacitive plates. A direct current (DC) bias voltage "V_PM" 128 is applied to the proof mass 110. When an electrical signal is applied to the proof mass 110 (e.g., a signal supplying a voltage that is additional to the bias voltage 128), a voltage difference is established between the proof mass 110 and each of the sense electrodes 120 and 122. This allows the displacement of the proof mass 110, and therefore the acceleration, to be detected as a change in capacitance. In particular, the size of the capacitive gaps is inversely proportional to the sensed capacitance. The spring 112 and the proof mass 110 form a spring system. When the accelerometer 100 is implemented as a MEMS device, the spring 112 can be constructed as a beam attached to the anchor 114 at one end and the proof mass 110 at the other end.

The tuning electrode 130 can, similar to the sense electrodes 120, 122, be placed at a distance away from the proof mass 110. When an electrical signal is applied to the proof mass 110 and/or to the tuning electrode 130, a voltage difference is established between the proof mass 110 and the tuning electrode 130. For example, a voltage can be applied to the tuning electrode 130 that is different from a voltage applied to the proof mass 110. This creates a negative contribution to the overall stiffness of the spring system formed by the spring 112 and proof mass 110, effectively softening the spring system. The electrical signal used for spring softening is applied separately from the electrical signal used for sensing the displacement of the proof mass. Additionally, the electrical signal for spring softening is substantially constant (e.g., a DC voltage) once applied, whereas the electrical signal for sensing can be a time varying signal, e.g., an amplitude modulated signal with a DC voltage of zero. The overall stiffness $k_{Total}$ of the spring system is described by the following equation:

$$k_{Total} = k_{Mechanical} + k_{Electrical} \quad (1)$$

where $k_{Electrical}$ is a negative stiffness generated using the tuning electrode and $k_{Mechanical}$ is the mechanical stiffness of the spring system. The value of $k_{Electrical}$ is:

$$k_{Electrical} = -N \frac{\epsilon A V^2}{gap^3} \quad (2)$$

where N is the number of tuning electrode parallel plates (e.g., N=1 in FIG. 1), E is the permittivity of free space, A is the area of the tuning electrode, V is the voltage difference between the proof mass and the tuning electrode, and "gap" is the distance between the tuning electrode and the proof mass.

In certain embodiments, the stiffness of the spring system is dynamically controlled (e.g., setting a value for the overall stiffness) based on the operational conditions of the accelerometer. Softening the spring system increases the sensitivity of the accelerometer, which is beneficial in certain situations such as during periods of infrequent changes in acceleration and/or periods in which the magnitude of the acceleration or displacement is below a certain threshold. However, softening the spring system has a tradeoff in that the full-scale range, and thus the resolution of the measurement, is reduced. There are other reasons why a stiffer spring system may be desirable. For example, making the spring system stiffer can limit the movement of the proof mass to prevent the proof mass from hitting adjacent structures in response to large accelerations. Accordingly, the stiffness of the spring system can be dynamically controlled such that the spring system is softened or softened to a greater extent in situations where increased sensitivity is desirable (e.g., during periods of infrequent or low acceleration), and such that the spring system is not softened or softened to a lesser extent in situations where increased full-scale range or protection against damage is desirable (e.g., during periods of large acceleration or shock).

In certain embodiments, an electronic control system is employed to change the electrical signal applied for electrostatic spring softening in real-time, on-demand, or as a factory calibration when the accelerometer is fabricated. For example, as mentioned above, the extent of spring softening can be based on detection of acceleration magnitude. The control system can be integrated into an accelerometer device. Alternatively, the control system can be an external system that determines the extent of spring softening based on detecting and/or generating an event relating to the accelerometer or the environment in which the accelerometer is deployed.

In certain embodiments, an accelerometer (e.g., accelerometer 100) is encapsulated in an epitaxially grown layer that provides a hermetic seal against contaminants. The encapsulating layer can be formed under vacuum conditions to maintain the pressure within the device at a low level, which reduces Brownian noise due to vibration of air molecules around the accelerometer.

Figure 2:
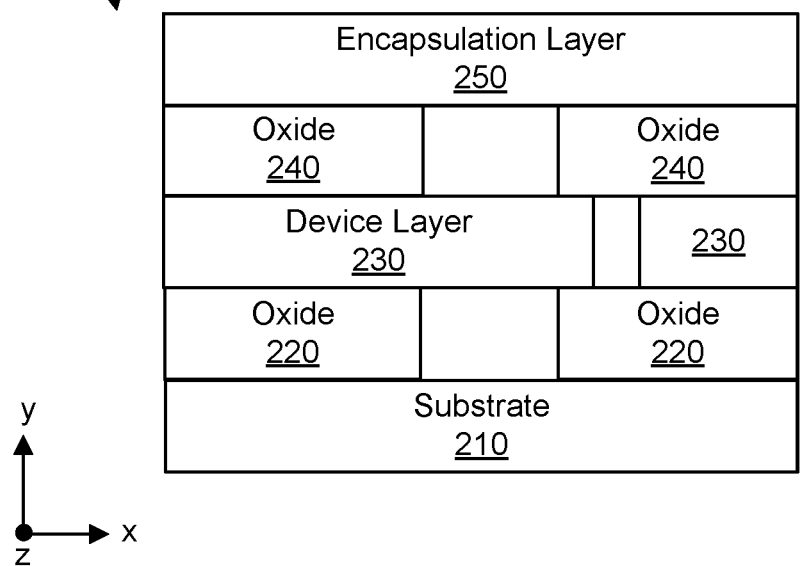
FIG. 2 is a simplified cross-sectional view of an example accelerometer that is encapsulated.

FIG. 2 is a simplified cross-sectional view of an example accelerometer 200 that is encapsulated. The accelerometer 200 includes a substrate 210, an oxide layer 220, a device layer 230, an oxide layer 240, and an encapsulation layer 250. The substrate 210 and the encapsulation layer 250 can be formed of a semiconductor, e.g., silicon. The oxide layers 220, 240 can be formed with silicon dioxide, and are selectively etched to form anchors for the device layer 230. The device layer 230 contains the spring, proof mass, and other device components such as those depicted in FIG. 1. The proof mass (not shown in the figure) within the device layer 230 moves in the x and y directions. Therefore, the sense electrodes primarily sense displacement in the x and y directions. Displacement along the z direction can be sensed via additional sense electrodes or using additional proof masses in different orientations.

In addition to the various layers depicted in FIG. 2, the accelerometer 200 can be housed within a package made of plastic or other material commonly used for packaging integrated circuits. The package is in direct contact with one or more layers of the accelerometer including, for example, the substrate 210 and the encapsulation layer 250. Thus, mechanical stresses applied to the packaging are potentially transferred to the device layer 230 even if the packaging may not be direct contact with the device layer 230.

Having described electrostatic spring stiffness control, the discussion now turns to resonant accelerometer designs. In a resonant accelerometer, a beam or other resonating element is driven, using frequency modulation, to vibrate at a certain frequency. This creates a standing wave in the resonating element. The vibration is similar to the vibration of a guitar string and is characterized by a periodic signal with a certain harmonic frequency. The resonating element is attached to a proof mass. As the proof mass moves, the frequency of the resonating element changes. Resonant accelerometers often employ resonating elements made of quartz, not semiconductor materials such as silicon.

Figure 3:
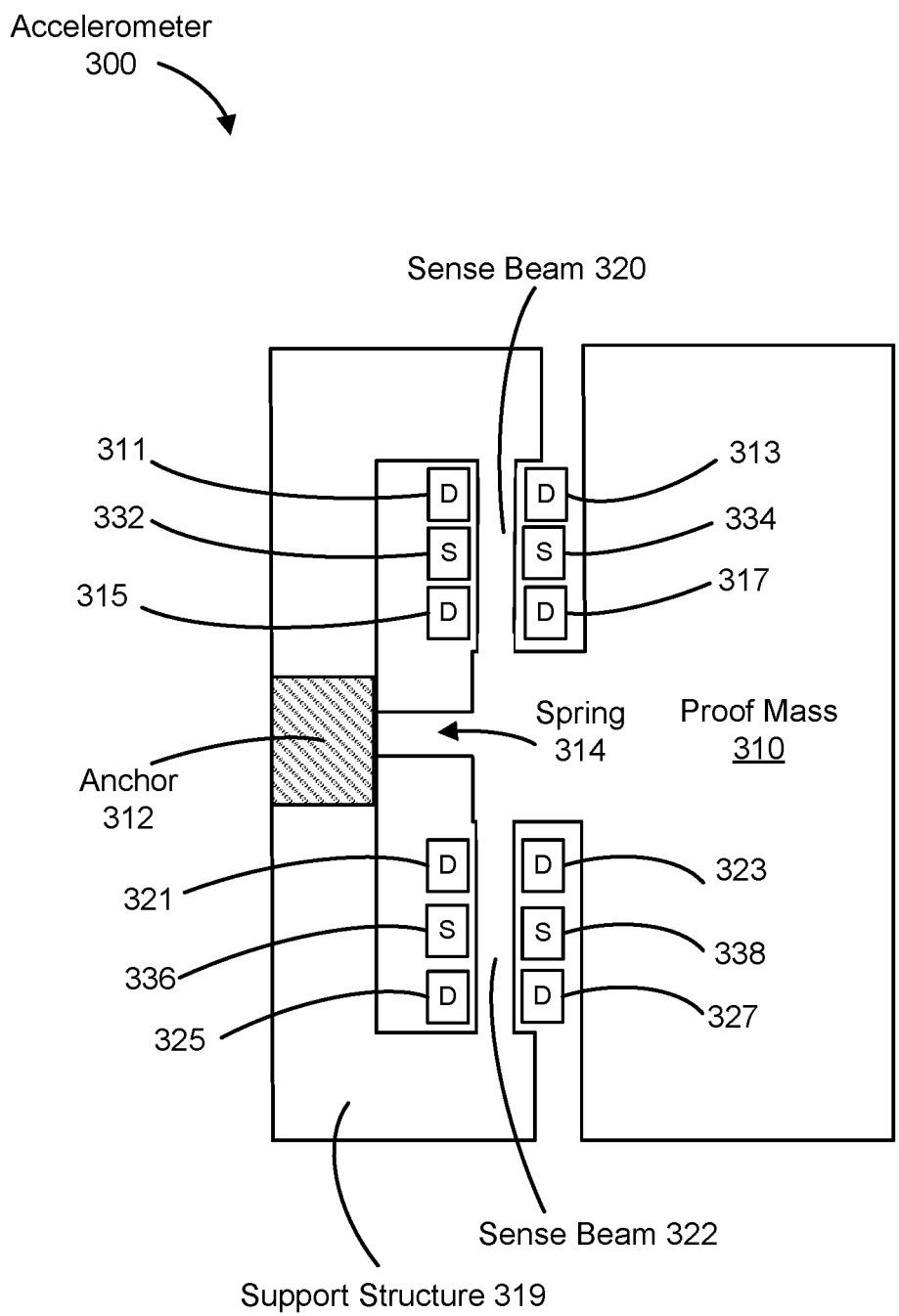
FIG. 3 shows a top view of an example resonant accelerometer, according to certain embodiments.

FIG. 3 shows a top view of an example resonant accelerometer 300, according to certain embodiments. The accelerometer 300 includes a proof mass 310 attached to an anchor 312 via a compliant element 314 (e.g. a MEMS beam) that acts as a spring. The anchor 312 can correspond to one of the oxide layers depicted in FIG. 2. The anchor 312 is attached to a support structure 319 from which the spring 314 extends. As shown in FIG. 3, the support structure 319 is "C" shaped. In certain embodiments, the support structure 319, the spring 314, and the proof mass 310 are formed from a monolithic block of semiconductor material, e.g., by selectively etching the semiconductor material.

The accelerometer 300 further includes a pair of sense beams 320, 322, each of which is attached to the proof mass 310 at one end and attached to the support structure 319 at the other end. Each sense beam 320, 322 is a cantilever beam with a plurality of electrodes positioned along the sides of the beam for driving the beam and sensing changes in the resonant frequency of the beam. The sense beams 320, 322 and sense beams in other resonant accelerometer designs disclosed herein can be driven to vibrate at a resonance frequency of any harmonic order (e.g., 1st harmonic, 2nd harmonic, 3rd harmonic, etc.). The total number and placement of electrodes can vary. In the example of FIG. 3, the sense beam 320 has four drive electrodes 311, 313, 315, and 317 located on opposite sides of the sense beam and a pair of sense electrodes 332, 334, also on opposite sides of the sense beam. Similarly, the sense beam 322 has four drive electrodes 321, 323, 325, and 327 and a pair of sense electrodes 336, 338 in locations analogous to those of the electrodes provided for the sense beam 320.

The proof mass 310 is displaced in response to acceleration, causing one of the sense beams 320, 322 to be placed under tension and the other of the sense beams 320, 322 to be placed under compression. This changes the resonance frequencies of both sense beams. In particular, the frequency of one sense beam goes up while the frequency of the other sense beam goes down. Thus, the sense beams 320, 322 provide differential sensing, which enables common mode rejection of frequency drift (e.g., due to temperature variation). However, sensing can be performed using only one sense beam. The positioning of the sense beams 320, 322 orthogonally to the lever enables the differential sensing. The structure of the accelerometer 300 creates a lever arm between the anchor 312 and the center of mass of the proof mass 310. The lever amplifies the force of acceleration.

In certain embodiments, changes in frequency of a sense beam or other resonating element are detected by a frequency comparator (not depicted) inside the accelerometer. In embodiments with two sense beams, the frequency difference between the two sense beams can be determined using another frequency comparator. A frequency comparator may be coupled to other circuitry for calculating the amount of acceleration based on the output of the frequency comparator. The frequency comparator and the other circuitry can be integrated into the accelerometer or remotely located. For example, in certain embodiments, a first frequency determined using the sense electrodes 332, 334 and a second frequency determined using the sense electrodes 336, 338 are input to a frequency comparator in an external controller that computes an acceleration value based on a mapping table stored in a memory, where the mapping table maps the difference in the frequency of the sense beam 320 and the frequency of the second sense beam 322 (as indicated by the output of the frequency comparator) to the acceleration value. In some embodiments, the controller can be the same controller, described below, that determines the overall stiffness of the spring system.

The structure of the accelerometer 300 is advantageous because there is only a single attachment point, i.e., the anchor 312, for the device layer components. In particular, the sense beams 320, 322 and the proof mass 310 are suspended from the same structure to which the anchor 312 is attached, i.e., support structure 319. This decouples the device layer components from the package and provides immunity to package stress and deformation, enabling package deformations in the horizontal direction (orthogonal to the sense beams) to be canceled out to the first order. In comparison to the accelerometer 100 of FIG. 1, the accelerometer 300 consumes more power as a result of actively driving the sense beams 320, 322. However, frequency modulation is potentially more stable over time and versus temperature due to sensing frequency instead of displacement. For example, changes in the capacitive gap in a quasi-static accelerometer such as the accelerometer 100 due to package stress, or drift in the sense electronics within a quasi-static accelerometer can potentially be interpreted as acceleration.

The spring softening techniques described earlier in connection with the example of FIG. 1 can be applied to any of the accelerometer designs disclosed herein. Thus, in certain embodiments, the accelerometer 300 can include one or more tuning electrodes placed around the proof mass 310 to adjust the overall stiffness of the spring system which, in the example of FIG. 3, includes the spring 314, the proof mass 310, and the sense beams 320, 322.

Figure 4:
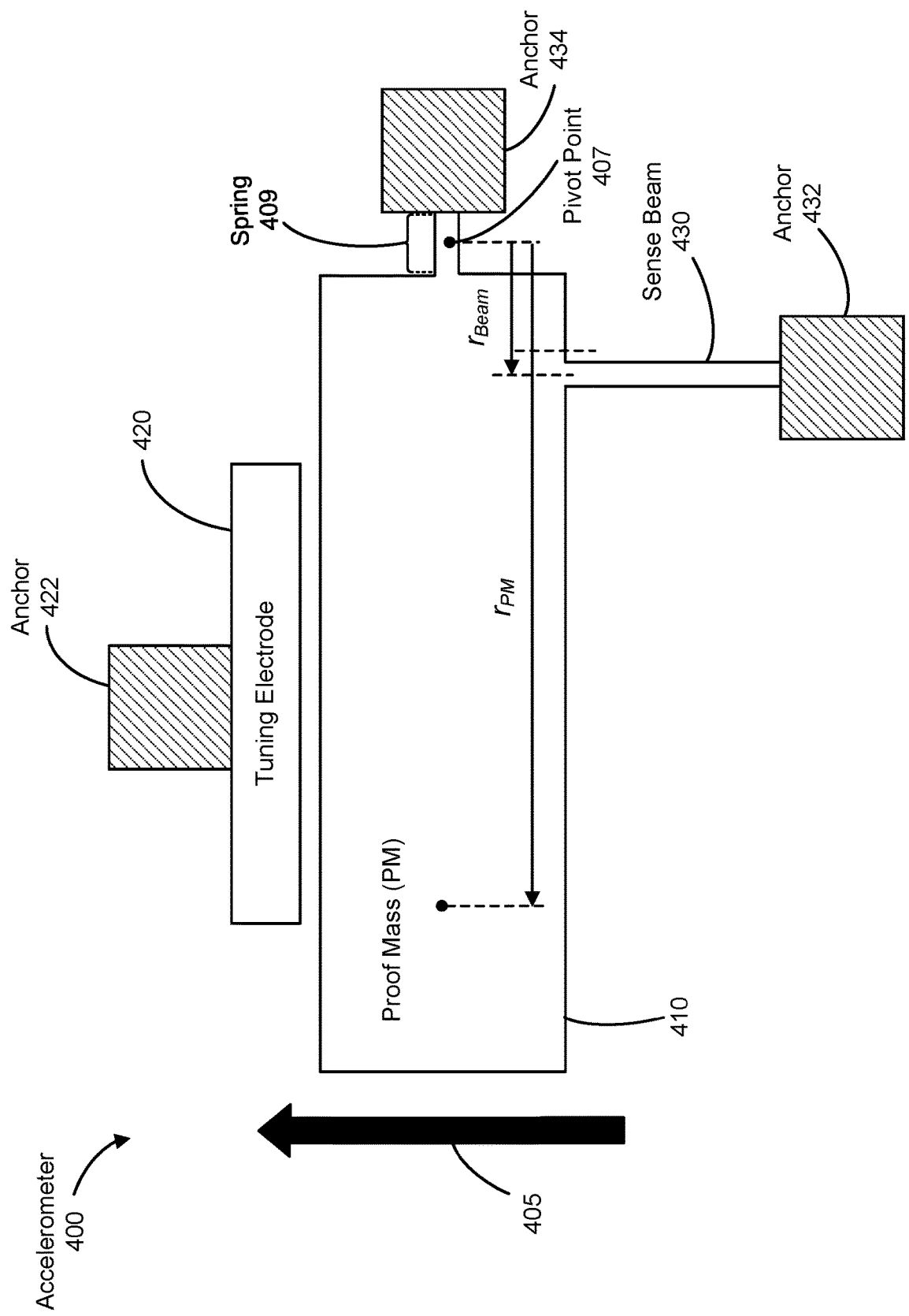
FIG. 4 is a conceptual diagram of a resonant accelerometer featuring spring softening, in accordance with certain embodiments.

FIG. 4 is a conceptual diagram of a resonant accelerometer 400 featuring spring softening, in accordance with certain embodiments. Drive and sense electrodes are omitted from the figure for simplicity. The accelerometer 400 includes a proof mass 410 coupled to an anchor 434 via a spring 409, such that the proof mass 410 moves about a pivot point 407 located on the spring 409 in response to acceleration 405. The accelerometer 400 further includes a tuning electrode 420 attached to an anchor 422 and a sense beam 430 attached to an anchor 432. As discussed earlier, a tuning electrode can be used to electrostatically soften the overall stiffness of the spring system based on applying an electrical signal that establishes a voltage difference between the proof mass and the tuning electrode. In FIG. 4, the distance between the pivot point 407 and the sense beam 430 is labeled $r_{Beam}$ and the distance between the pivot point 407 and the equivalent mass is labeled $r_{PM}$. The distance $r_{PM}$ corresponds to a lever that amplifies the acceleration 405.

In certain embodiments, a resonant accelerometer employs a feedback loop that controls the oscillation of one or more sense beams. For example, the drive signal applied to the drive electrode(s) of the resonant accelerometer can be dynamically adjusted, using amplitude gain control (AGC) and an oscillator loop, in order to sustain and control the amplitude of oscillation in the sense beam(s).

Figure 5:
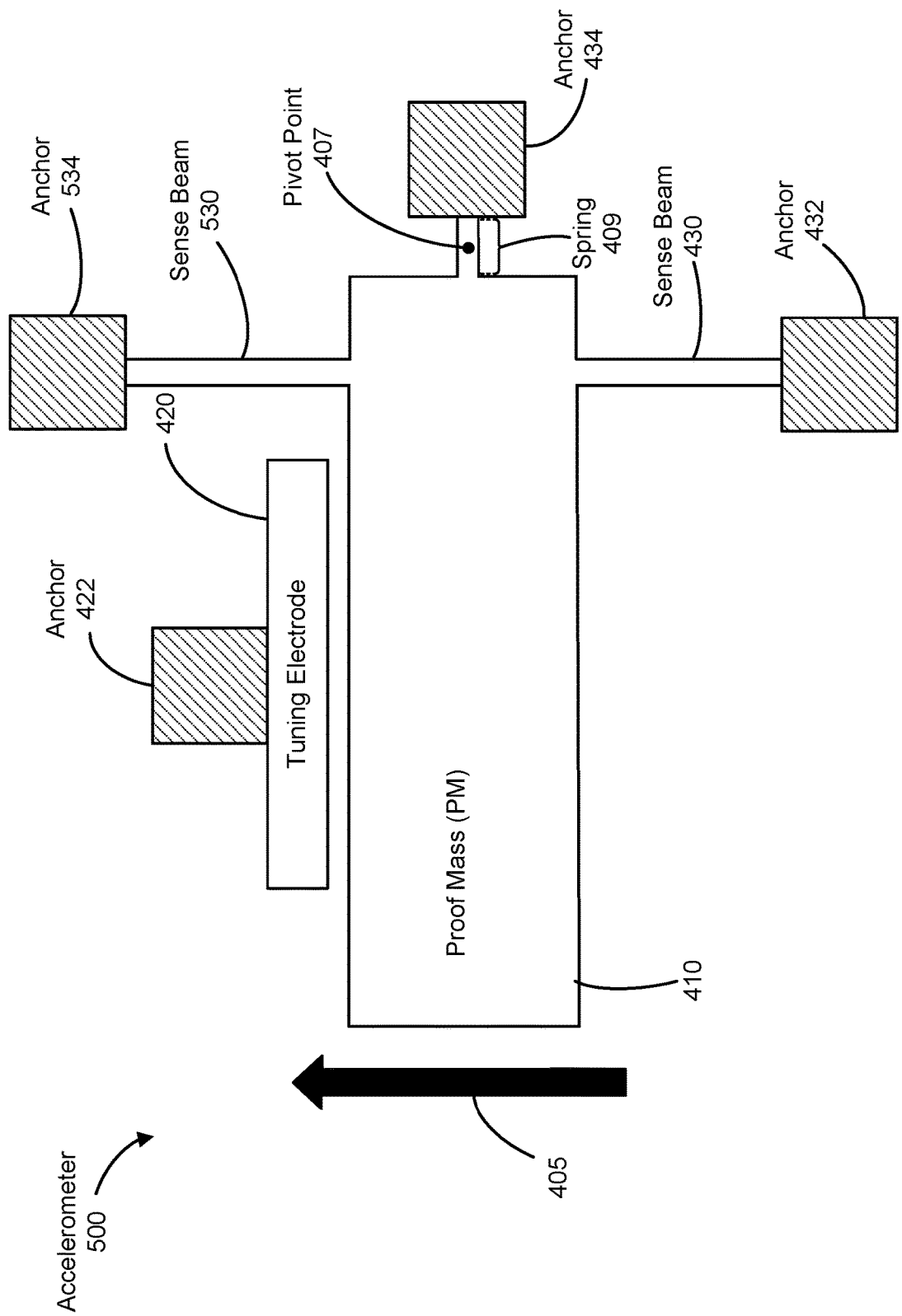
FIG. 5 is a conceptual diagram of a resonant accelerometer, in accordance with certain embodiments.

FIG. 5 is a conceptual diagram of a resonant accelerometer 500, in accordance with certain embodiments. The accelerometer 500 is identical to the accelerometer 400 in FIG. 4, except for the addition of a second sense beam 530 attached to an anchor 534. The combination of sense beam 430 and sense beam 530 provides differential sensing that enables common mode rejection. Common mode rejection is explained in further detail below in connection with FIG. 13.

Figure 6:
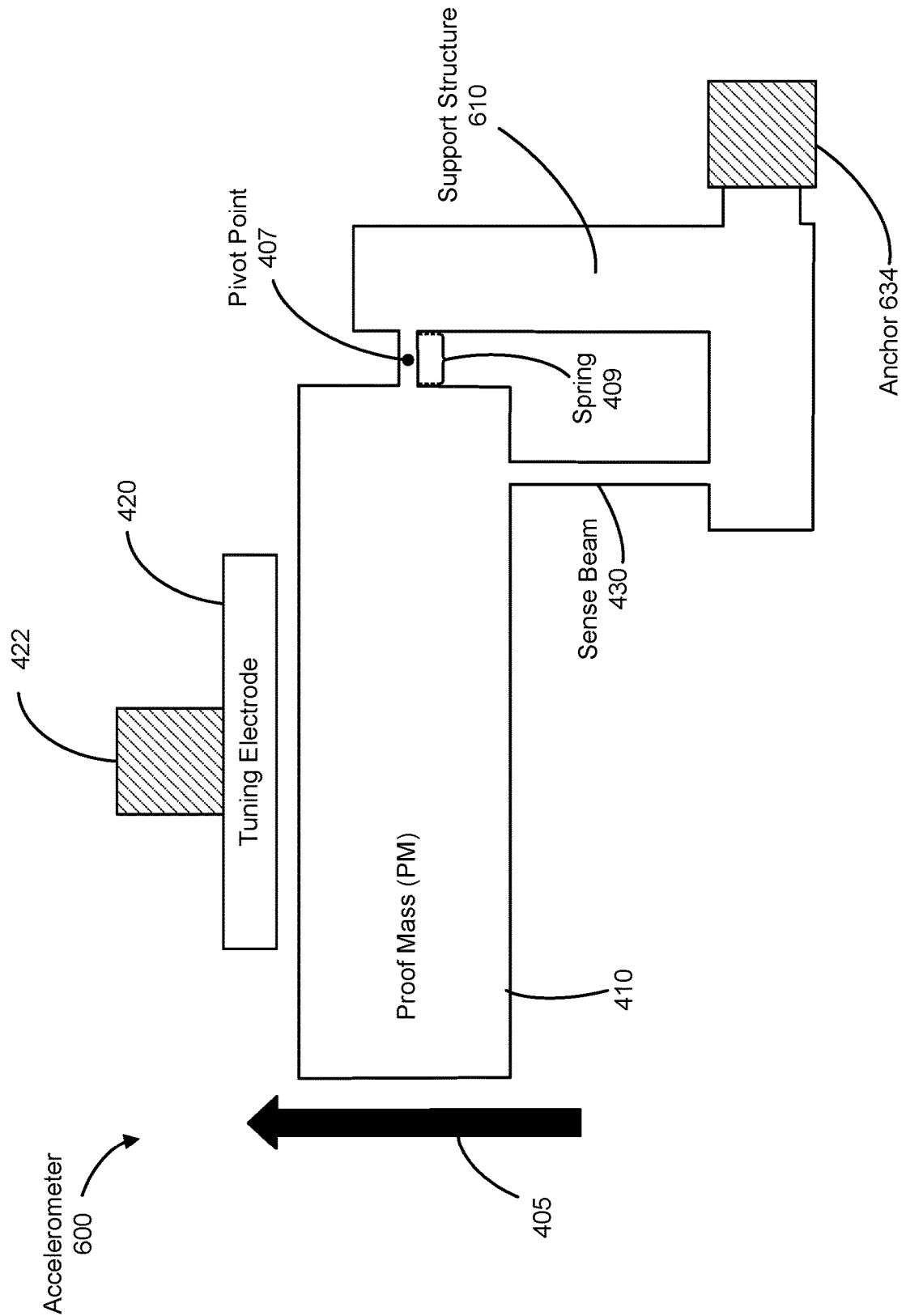
FIG. 6 is a conceptual diagram of a resonant accelerometer, in accordance with certain embodiments.

FIG. 6 is a conceptual diagram of a resonant accelerometer 600, in accordance with certain embodiments. The accelerometer 600 is identical to the accelerometer 400 in FIG. 4, except that the spring 409 and the sense beam 430 are attached to a shared anchor 634 via a support structure 610. Thus, the entire mechanical assembly is suspended from the same anchor 634. The reduction in the number of anchors as compared to the embodiment of FIG. 4 provides added stress isolation.

Figure 7:
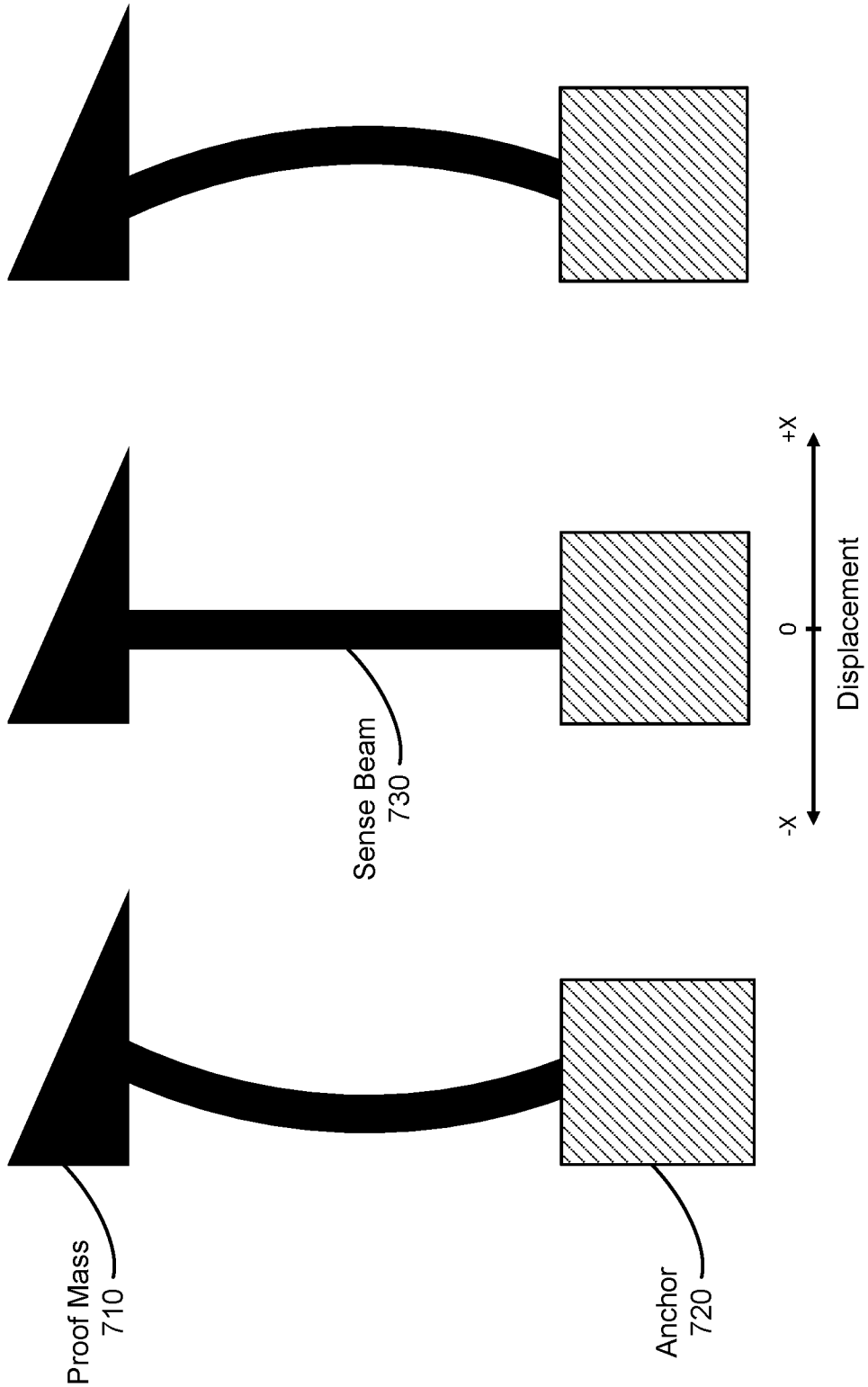
FIG. 7 illustrates vibration of a sense beam in a resonant accelerometer.

FIG. 7 illustrates the vibration of a sense beam 730 in a resonant accelerometer. The sense beam 730 is attached between a proof mass 710 and an anchor 720. The sense beam 730 may, for example, correspond to the sense beam 430 in FIG. 4. In response to frequency modulation, the sense beam 730 oscillates back and forth at a certain resonance frequency. As shown in FIG. 7, the displacement of the sense beam 730 is at a maximum at the center (the midpoint along the longitudinal axis) of the sense beam. Thus, in an accelerometer that employs resonant sensing, it can be advantageous to place a sense electrode near the center of the beam, for example, as shown in FIG. 3.

Figure 8B:
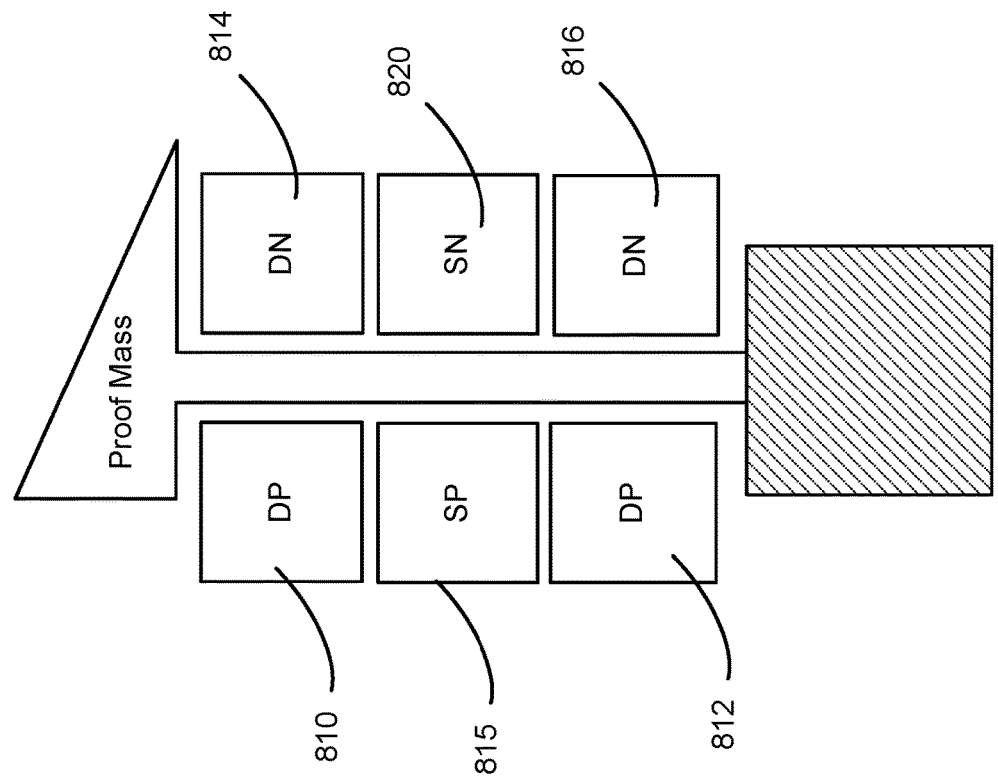
FIG. 8B illustrates a differential transduction configuration for a resonant accelerometer.
Figure 8A:
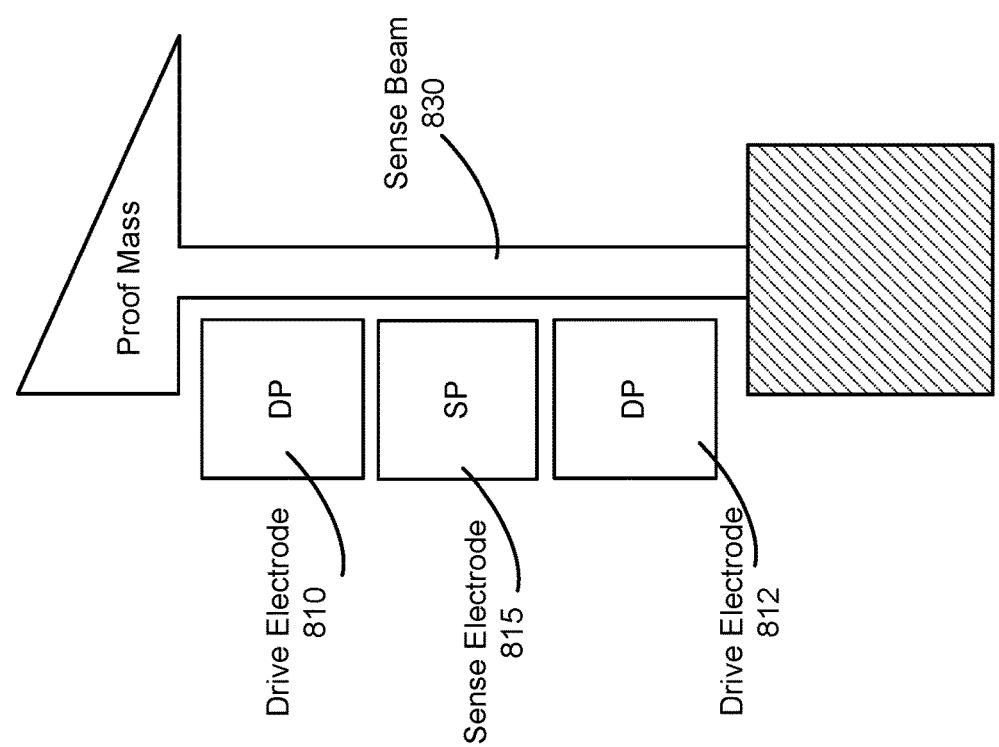
FIG. 8A illustrates a single-ended transduction configuration for a resonant accelerometer.

FIG. 8A illustrates a single-ended transduction configuration for driving and sensing in a resonant accelerometer. In FIG. 8A, a plurality of drive electrodes 810, 812 are used to apply an electrostatic force that drives a sense beam 830 to vibrate, i.e., oscillate at a resonance frequency. The vibration is sensed by a sense electrode 815. The use of multiple drive electrodes is optional, but can increase the drive force applied to the sense beam. In this example, both drive electrodes 810, 812 may receive the same drive signal for driving the sense beam 830. The drive signal can be any harmonic signal, e.g., a square wave, a sine wave, a sawtooth signal, etc. In certain embodiments, the driving and sensing functionality provided by the electrodes 810, 812, and 815 can be consolidated into a single electrode that is switched been driving and sensing operations, e.g., using time domain multiplexing.

FIG. 8B illustrates a differential transduction configuration for a resonant accelerometer. The configuration in FIG. 8B is identical to the configuration in FIG. 8A, except that an additional set of electrodes is placed on an opposite side of the sense beam 830. The drive electrode 810 is a positive electrode paired with a negative drive electrode 814. Similarly, the drive electrode 812 is a positive electrode paired with a negative drive electrode 816, and the sense electrode 815 is a positive electrode paired with a negative sense electrode 820. The differential transduction configuration in FIG. 8B is with respect to a single sense beam, and is therefore distinct from the differential sensing discussed earlier, where two sense beams are used for common mode rejection. In FIG. 8B, it is the sensing and driving electrodes which are differential, not the sense beams since there is only one sense beam in the example of FIG. 8B. The differential transduction configuration in FIG. 8B also doubles the transduction surface area per sense beam, which amplifies the measured acceleration.

Although the embodiments described herein involve electrostatic transduction mechanisms for driving and sensing (e.g., using driving and/or sensing electrodes placed at a distance from a surface of a sense beam), other transduction mechanisms are also possible, such as using piezoresistive or piezoelectric elements attached directly to the sense beam 830.

Having described various configurations for driving and sensing in a resonant accelerometer, as well as techniques for electrostatically softening the overall stiffness of a spring system in an accelerometer, the operation of a resonant accelerometer that incorporates electrostatic spring softening will now be described.

In general, acceleration applied to a proof mass in a spring system is characterized as follows:

$$F = m_{eq} a = k_{Total} x_{PM} \tag{3}$$

where F is force, $m_{eq}$ is the equivalent mass of the proof mass assembly, and a is the acceleration. The proof mass assembly includes the proof mass, sense beam, spring, and all other components that move as a result of acceleration (e.g., the anchors and electrodes are excluded). As shown in Equation 3, the force F can be expressed in terms of the overall stiffness $k_{Total}$ of the spring system from Equation 1 and the displacement $x_{PM}$ of the proof mass.

When the sense beam is located at a different point than the equivalent mass, the displacement $x_{Beam}$ of the sense beam will be different from the displacement $x_{PM}$ of the proof mass, and is characterized by the following equations:

$$x_{Beam}/r_{Beam} = x_{PM}/r_{PM} \tag{4}$$

$$x_{Beam} = \frac{x_{PM} r_{Beam}}{r_{PM}} = \frac{m_{eq} a r_{Beam}}{k_{Total} r_{PM}} \tag{5}$$

where $r_{Beam}$ and $r_{PM}$ are the distances described above in connection with FIG. 4.

Applying Equations 1 to 5, the resonance frequency of the sense beam will change according to:

$$f(x_{Beam}) = f_o \sqrt{1 + \frac{2}{7} \frac{L_{Beam}}{W_{Beam}^2} x_{Beam}} \tag{6}$$

$$\Delta f(x_{Beam}) = f_o \left( \sqrt{1 + \frac{2}{7} \frac{L_{Beam}}{W_{Beam}^2} \frac{m_{eq} a r_{Beam}}{\left(k_{Mechanical} - N \frac{\epsilon A V^2}{gap^3}\right) r_{PM}}} - 1 \right) \tag{7}$$

where $f(x_{Beam})$ is the sense beam frequency as a function of axial displacement, $\Delta f(x_{Beam})$ is the change in a single sense beam's frequency as a function of axial displacement (multiply by 2 for differential sense beams), $f_0$ is the resonance frequency of the sense beam without axial strain (e.g., in the absence of tensile or compressive force on the sense beam), $L_{Beam}$ is the length of the sense beam, and $W_{Beam}$ is the width of the sense beam.

As apparent from Equation 7, electrostatic spring softening will influence the change in resonance frequency of the sense beam. The magnitude of the change in resonance frequency, and thus the sensitivity of the resonant accelerometer, will increase in response to spring softening.

Various innovative features were described above with respect to different resonant accelerometer designs. Another innovative feature which can be incorporated into a resonant accelerometer is the placement of the anchor point(s) and the sense beam(s) inside the area of the proof mass. Placing the anchor points and sense beams within the area of the proof mass provides added isolation against package stress while reducing the footprint of the accelerometer. As will become apparent from the embodiments described below, these and other features described herein can be combined in a single accelerometer.

Figure 9:
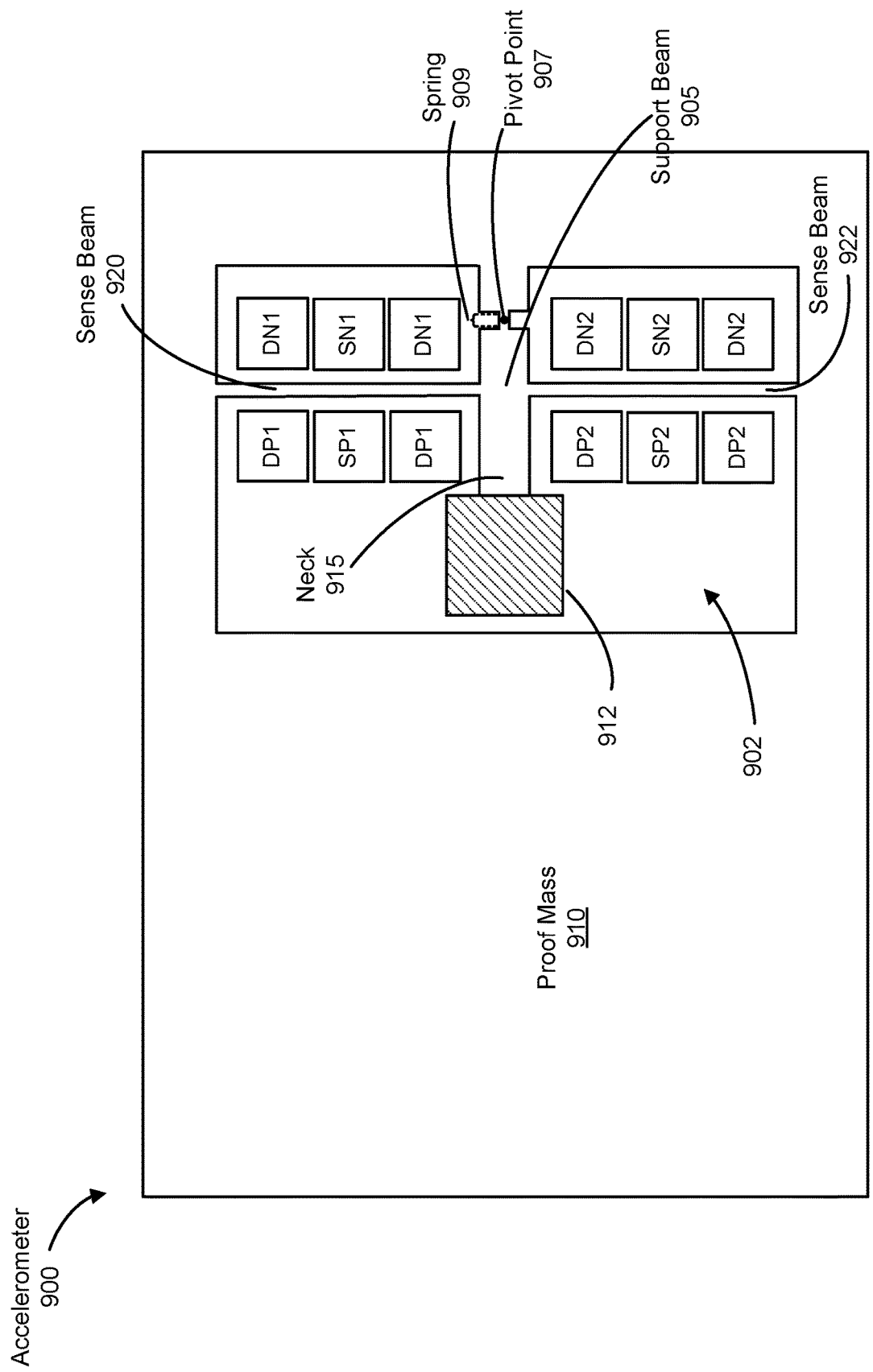
FIG. 9 is a top view of a resonant accelerometer, according to certain embodiments.

FIG. 9 is a top view of a resonant accelerometer 900, according to certain embodiments. The accelerometer 900 includes a proof mass 910 that is shaped to define a frame within which the driving and sensing components are located. As shown in FIG. 9, the proof mass 910 includes an opening 902 within which a pair of sense beams 920, 922 are coupled to an anchor 912 via a support beam 905. Each of the sense beams 920, 922 is attached to the proof mass 910 at one end (at a surface of the opening 902) and to the support beam 905 at the other end. The sense beams 920, 922 can be driven to resonate at different frequencies. Similar to the configuration in FIG. 8B, each sense beam 920, 922 includes, on each side of the beam, two drive electrodes and one sense electrode for a total of four drive electrodes and two sense electrodes per sense beam. The anchor 912 can be placed near the center of mass of the proof mass 910 in order to make the accelerometer robust to out-of-plane forces due to shock and stiction.

The anchor 912 supports the entire spring system via the support beam 905. The sense beams 920, 922 are attached to the support beam 905 at one end and to the inner edge of the frame of the proof mass at the other end. The thickness of the support beam 905 is reduced toward one end to form a spring 909 with a pivot point 907. In certain embodiments, the component that couples the sense beams and the proof mass to the anchor (e.g., the support beam 905) is integral with the body of the proof mass. For example, the proof mass 910, the sense beams 920, 922, the spring 909, and the support beam 905 can be formed from a monolithic layer of silicon or other semiconductor material by selectively etching the layer.

By defining a frame within the area of the proof mass 910, the sense beams 920, 922 and their associated electrodes can be placed within the area of the proof mass 910 without concern for space constraints, as might be true of conventional designs where the sense beams are located outside the proof mass. As shown in FIG. 9, the frame structure can be sized with sufficient room for accommodating multiple electrodes on either side of a sense beam, allowing for differential driving and sensing for each individual sense beam 920, 922 via positive and negative electrodes. Additionally, the frame structure can accommodate multiple sense beams placed in a collinear fashion, as in FIG. 9, to provide common mode rejection. Another advantage of the configuration in FIG. 9 is that there is a single "neck" 915 between the anchor 912 and the sense beams 920, 922, as well as between the anchor 912 and the proof mass 910. The neck 915 is located on the support beam 905 and corresponds to a stress decoupling area where strain from the anchor 912 (e.g., due to package stress) is at least partially rejected, preventing such strain from propagating to the proof mass and the sense beams 920, 922. The size and location of the neck 915 depends on the geometry of the support beam 905, e.g., the cross-sectional thickness or shape of the support beam 905.

Figure 10:
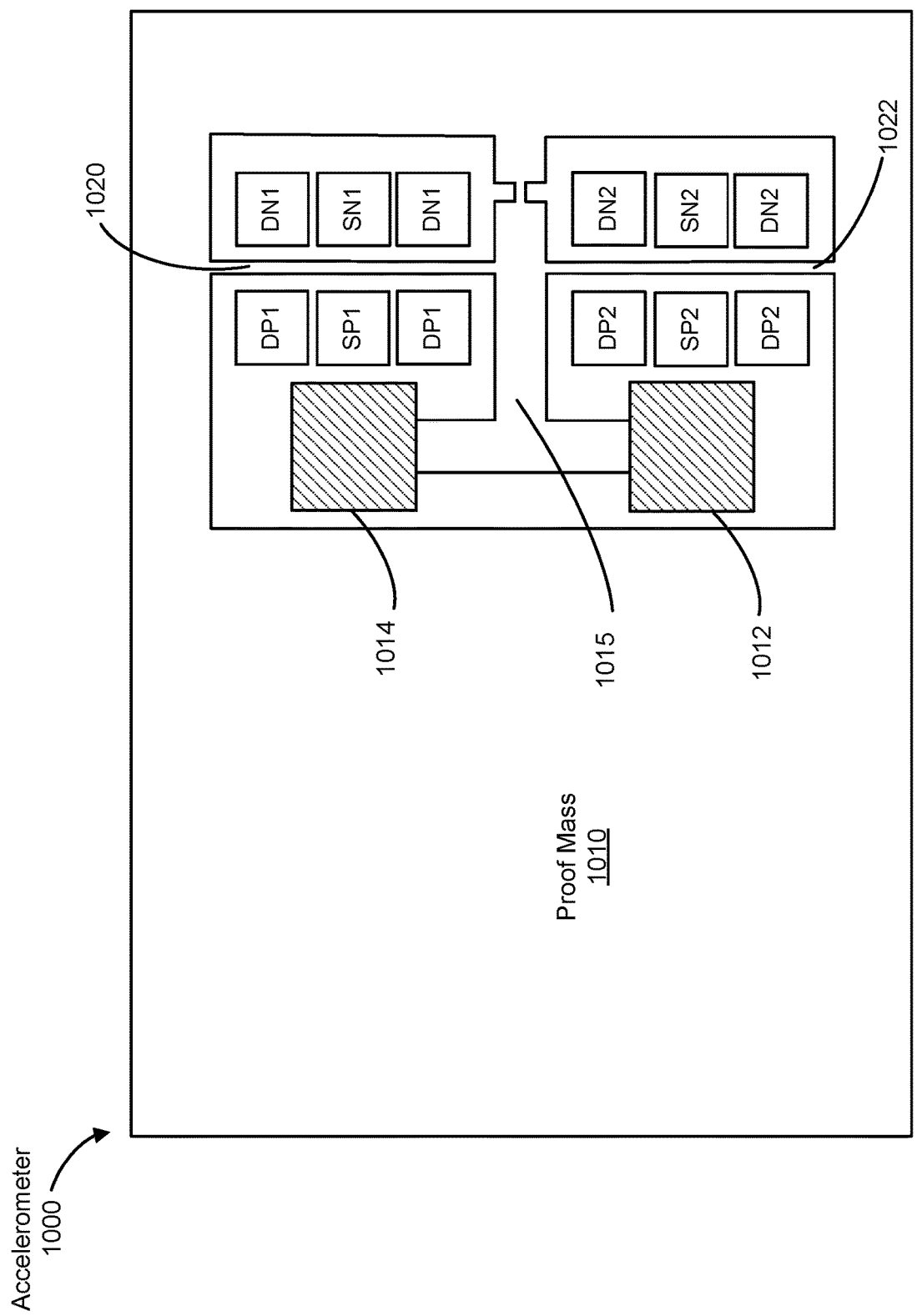
FIG. 10 is a top view of a resonant accelerometer, according to certain embodiments.

FIG. 10 is a top view of a resonant accelerometer 1000, according to certain embodiments. The accelerometer 1000 is identical to the accelerometer 900, except that instead of a single anchor, there are two anchors 1012, 1014 attached to a "T" shaped support structure 1015. The support structure 1015 is analogous to the support beam 905 in FIG. 9.

Although there are two anchors, because both anchors 1012, 1014 attach to the support structure 1015, there is still only one neck between the anchors 1012, 1014 and the sense beams 1020, 1022 and between the anchors 1012, 1014 and the proof mass 1010. Thus, the support structure 1015 offers the same stress decoupling benefits described above with respect to the support beam 905 in FIG. 9. Additionally, because the support structure 1015 includes orthogonal segments that form a "T" shape, the support structure 1015 is relatively more rigid compared to the support beam 905. The inclusion of orthogonal elements (e.g., the segments of the support structure 1015 or the support beam 905 in relation to the sense beams 920, 922) generally increases rigidity, which reduces stiction so that the proof mass can more easily begin moving.

Figure 11:
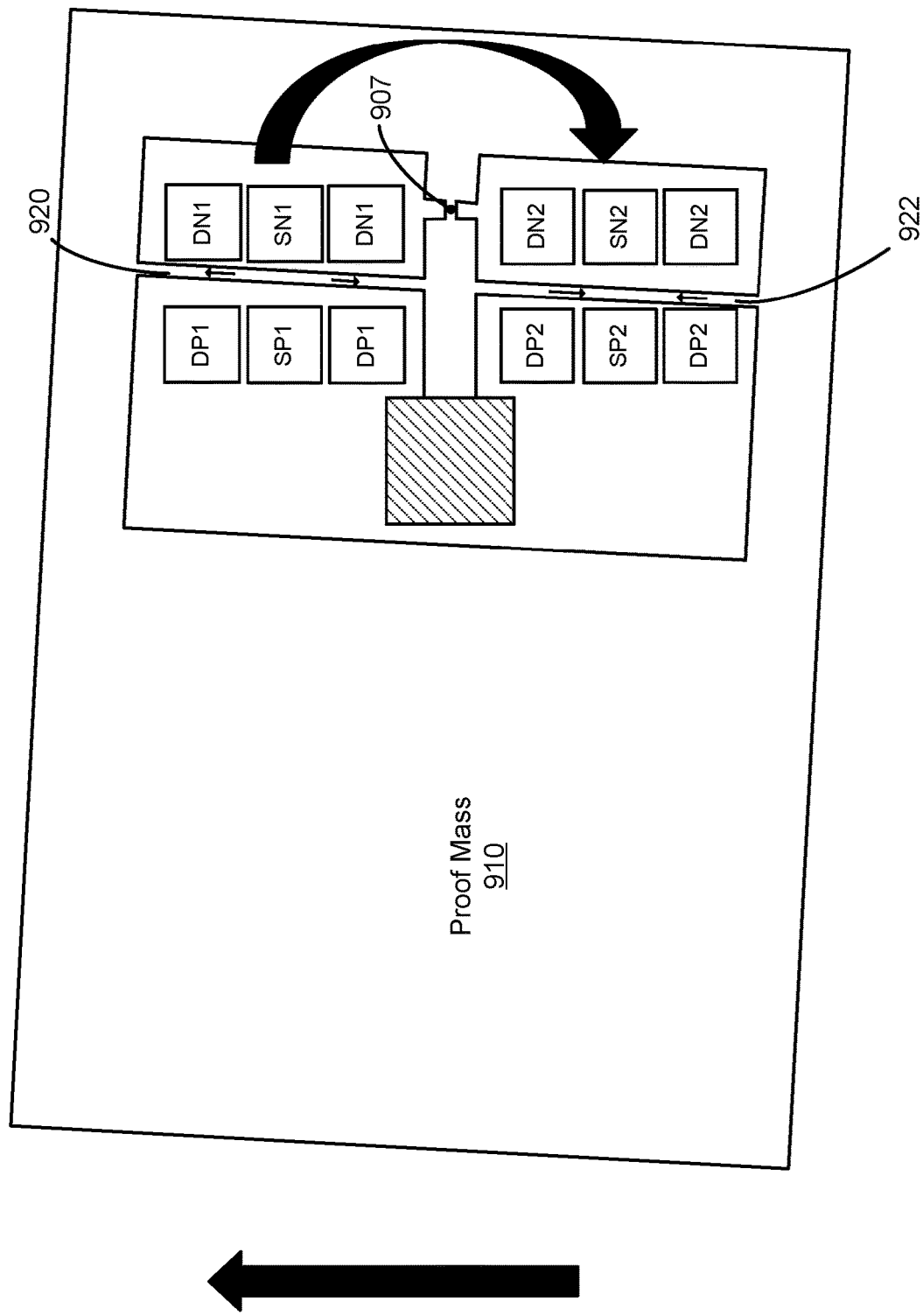
FIG. 11 illustrates rotation of a proof mass in the accelerometer from FIG. 9 in response to acceleration.

FIG. 11 illustrates rotation of the accelerometer 900 from FIG. 9 in response to acceleration. In the example of FIG. 11, the acceleration places the sense beam 920 under tension and the sense beam 922 under compression as the proof mass 910 rotates about the pivot point 907.

Figure 12:
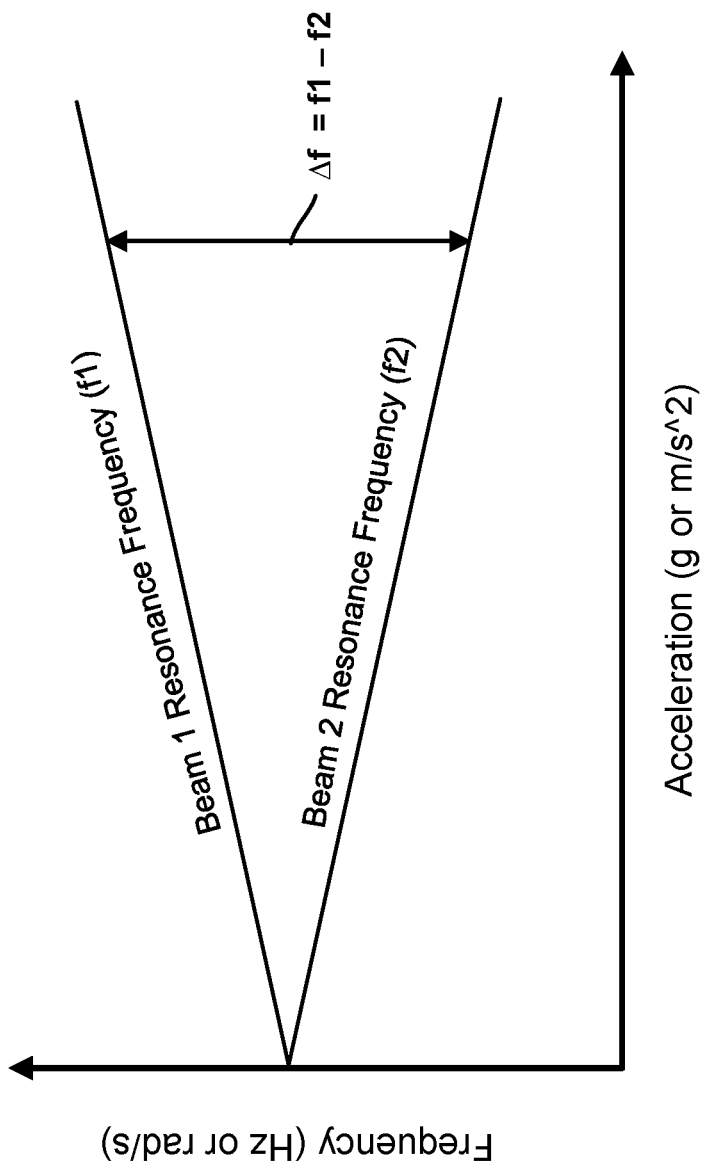
FIG. 12 is a graph illustrating change in resonance frequencies of sense beams in a resonant accelerator.

FIG. 12 is a graph illustrating the change in resonance frequencies of two sense beams (measured in Hertz or radians per second) as a function of acceleration (measured in units of gravitational force (g) or meters per squared second) when one of the beams is under tension and the other compression, e.g., as in the example of FIG. 11. As shown in FIG. 12, the frequencies of the two sense beams diverge with increasing acceleration. The resonance frequency of the beam under tension will increase with increasing acceleration, while the resonance frequency of the beam under compression decreases. Therefore, the acceleration can be measured based on the difference between the frequencies of the beams.

Figure 13:
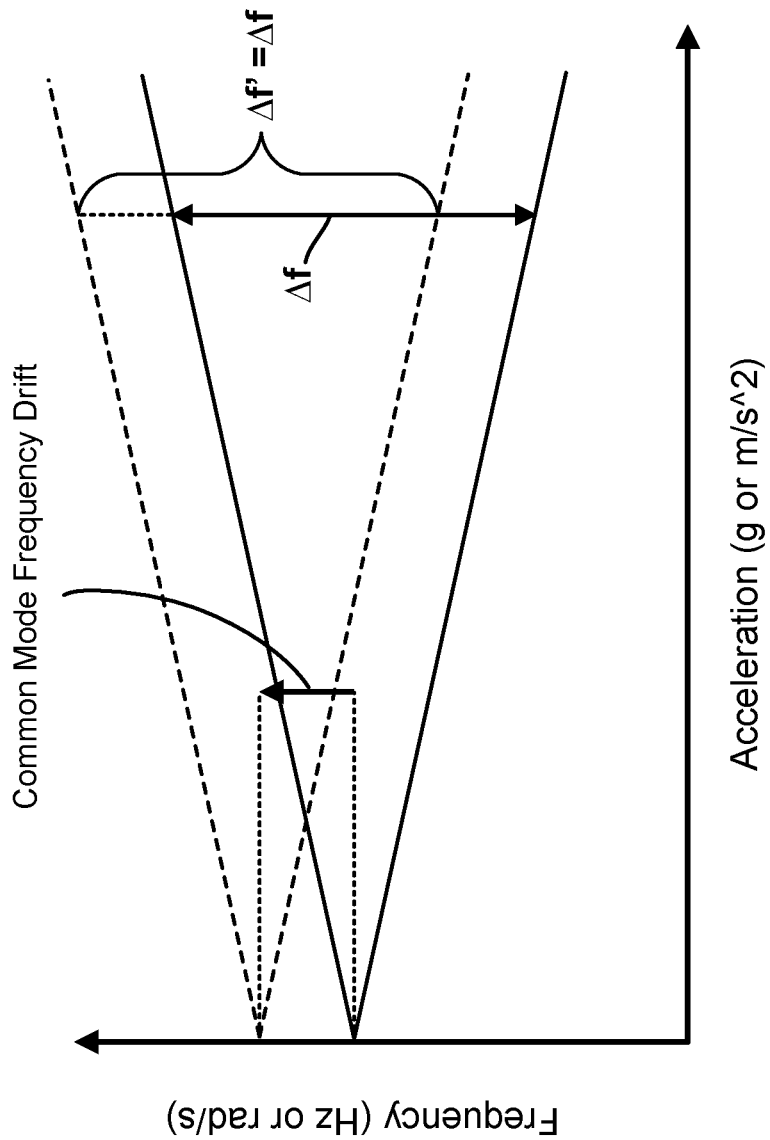
FIG. 13 is a graph illustrating the effects of common mode drift on the frequency response of sense beams in a resonant accelerator.

FIG. 13 is a graph illustrating the effects of common mode drift (e.g., due to temperature change) in the frequency response of two sense beams. The solid lines represent the same frequency response depicted in FIG. 12. The dashed lines represent the modified frequency response due to common mode drift. As shown in FIG. 13, both beams exhibit the same degree of frequency drift. Despite the frequency drift, the acceleration can still be measured based on the difference between the frequencies of the beams. Therefore, and as mentioned earlier, using two or more beams enables common mode rejection. Although FIG. 13 depicts the frequencies of both beams drifting by the same amount, in practice beams can drift by different amounts. Nevertheless, the acceleration can be measured as long as the frequency difference between the beams can be calculated.

Figure 14:
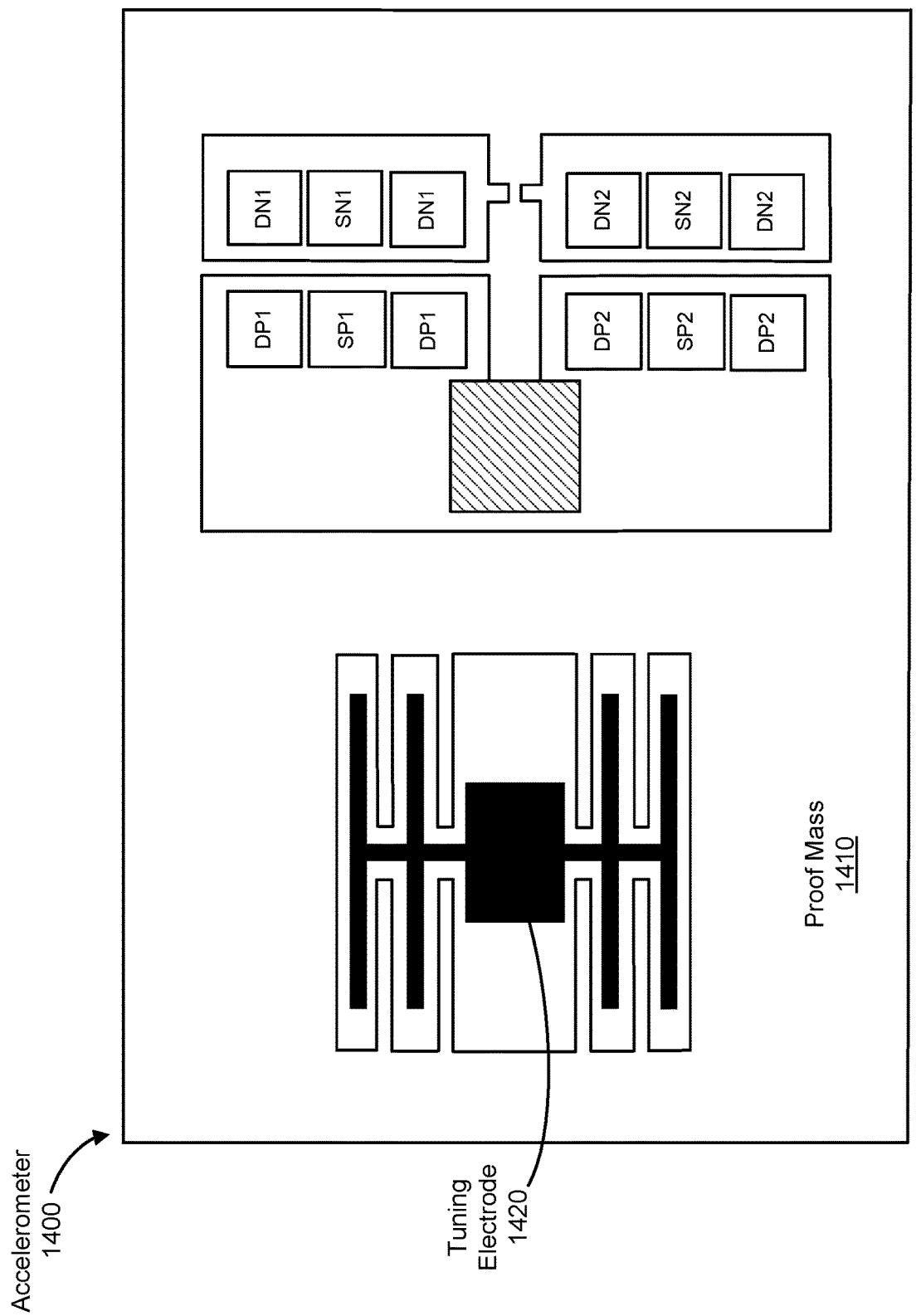
FIG. 14 is a top view of a resonant accelerometer, according to certain embodiments.

FIG. 14 is a top view of a resonant accelerometer 1400, according to certain embodiments. The accelerometer 1400 is identical to the accelerometer 900 in FIG. 9, except that a tuning electrode 1420 has been added within a separate opening inside proof mass 1410. Thus, the accelerometer 1400 features all the advantages of the accelerometer 900 plus the additional advantages of electrostatic spring softening. In the example of FIG. 14, the tuning electrode 1420 is shaped as a comb with an array of fingers that increase the surface area over which the spring softening signal is applied.

Figure 15:
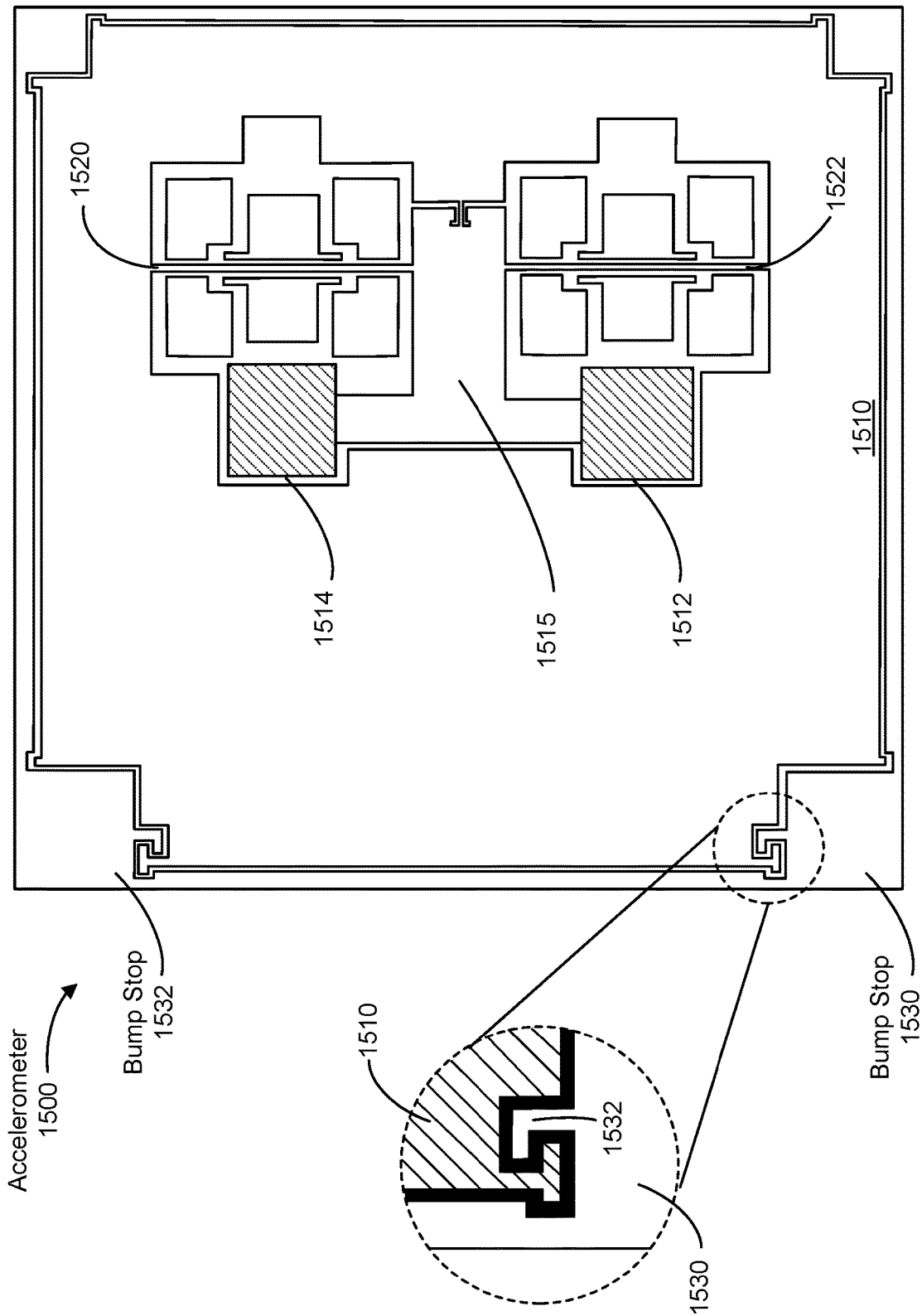
FIG. 15 illustrates an implementation of the accelerometer design shown in FIG. 10.

FIG. 15 illustrates a layout of an implementation of the accelerometer design shown in FIG. 10. FIG. 15 shows an accelerometer 1500 with components corresponding to those described with respect to the accelerometer 1000, including a pair of anchors 1512, 1514, a pair of sense beams 1520, 1522, and a support structure 1515. The components of accelerometer 1500 are depicted closer to their actual proportions and, in general, with greater geometric detail compared to the earlier figures. Therefore, the sizes of certain components have been reduced (e.g., sense beams 1520, 1522) relative to their counterparts in FIG. 10, as has the relative spacing between components, while some components may appear larger.

The accelerometer 1500 includes a pair of bump stops 1530, 1532, each of which includes a projection shaped to interlock with a complementary structure on the body of the proof mass 1510 (e.g., an "L" shaped projection 1532, as shown in more detail in the inset image in FIG. 15). The bump stops 1530, 1532 can be formed in a device layer that is attached to a substrate (e.g., formed in device layer 230 of FIG. 2), and can be separated from the proof mass 1510 (e.g., by a gap of approximately 1.5 microns) to permit the proof mass 1510 to move a certain distance before hitting the bump stops 1530, 1532. Thus, the bump stops 1530, 1532 restrict the range of motion of the proof mass 1510 so that the proof mass 1510 is prevented from moving beyond a certain point corresponding to a point at which the proof mass 1510 comes into interlocking contact with one or more of the bump stops 1530, 1532. The degree of separation between the proof mass and the bump stops can be set according to the desired range of motion, e.g., in order to prevent excessive motion that would break some of the more fragile components such as the sense beams 1520, 1522 or the spring. Although FIG. 15 shows two bump stops, the number of bump stops can vary depending on the manner in which the motion of the proof mass is to be constrained. A single bump stop would be sufficient to constraint motion in the horizontal and vertical directions. Two bump stops in different locations (e.g., opposite corners, as in FIG. 15) would also constrain rotation. Additionally, bump stops need not be located at corners, but can be in other locations, e.g., in an opening within the area of the proof mass.

Figure 16:
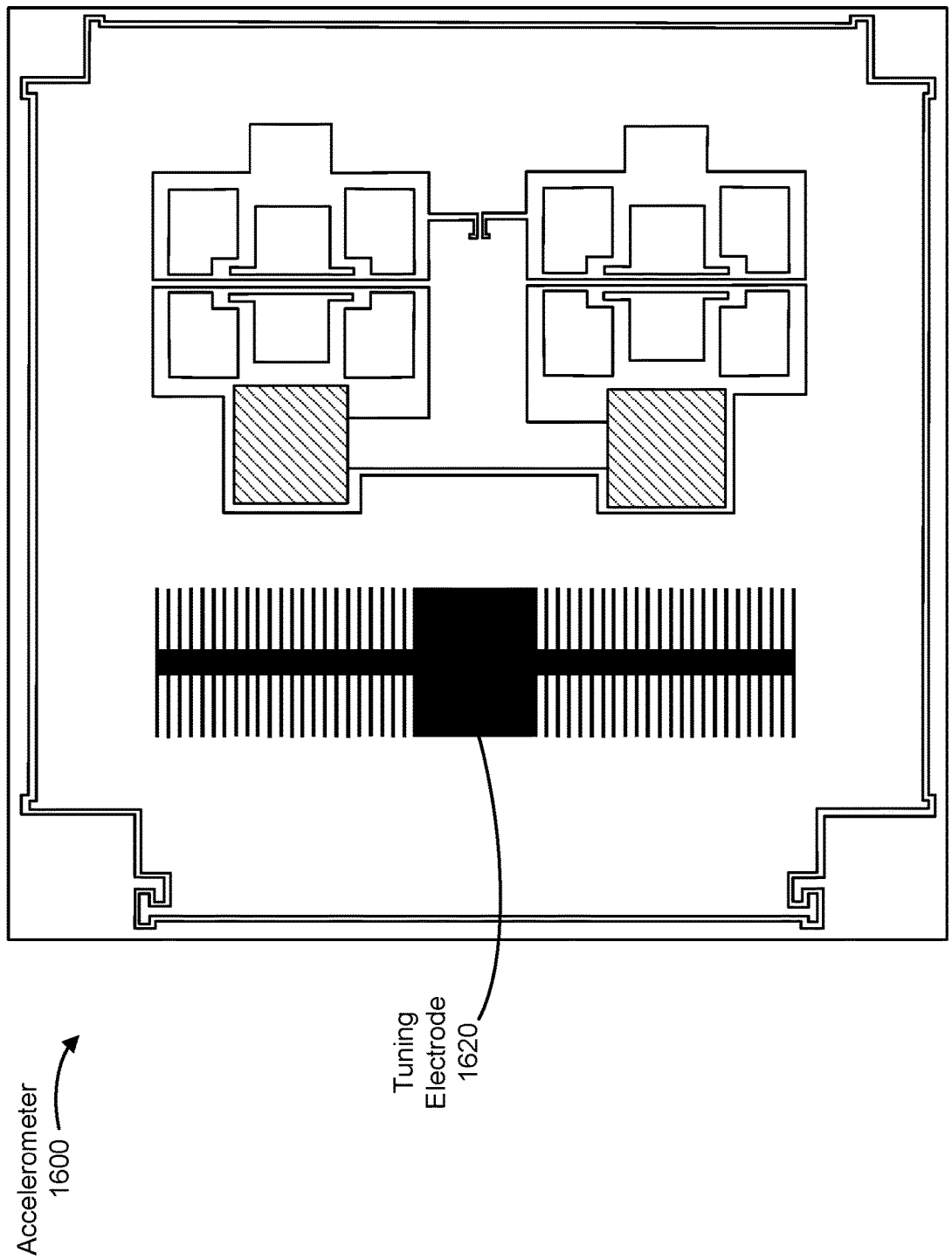
FIG. 16 illustrates a variation on the implementation in FIG. 15 that includes spring softening capability.

FIG. 16 shows an embodiment of an accelerometer 1600 corresponding to the resonant accelerometer of FIG. 15, but with a tuning electrode 1620 added within the area of the proof mass. The spacing between the tuning electrode 1620 and the proof mass is omitted from FIG. 16. However, it will be understood that the tuning electrode 1620 (and similarly the tuning electrodes in FIG. 17) can be separated from the body of the proof mass, as shown in the example of FIG. 14.

Figure 17:
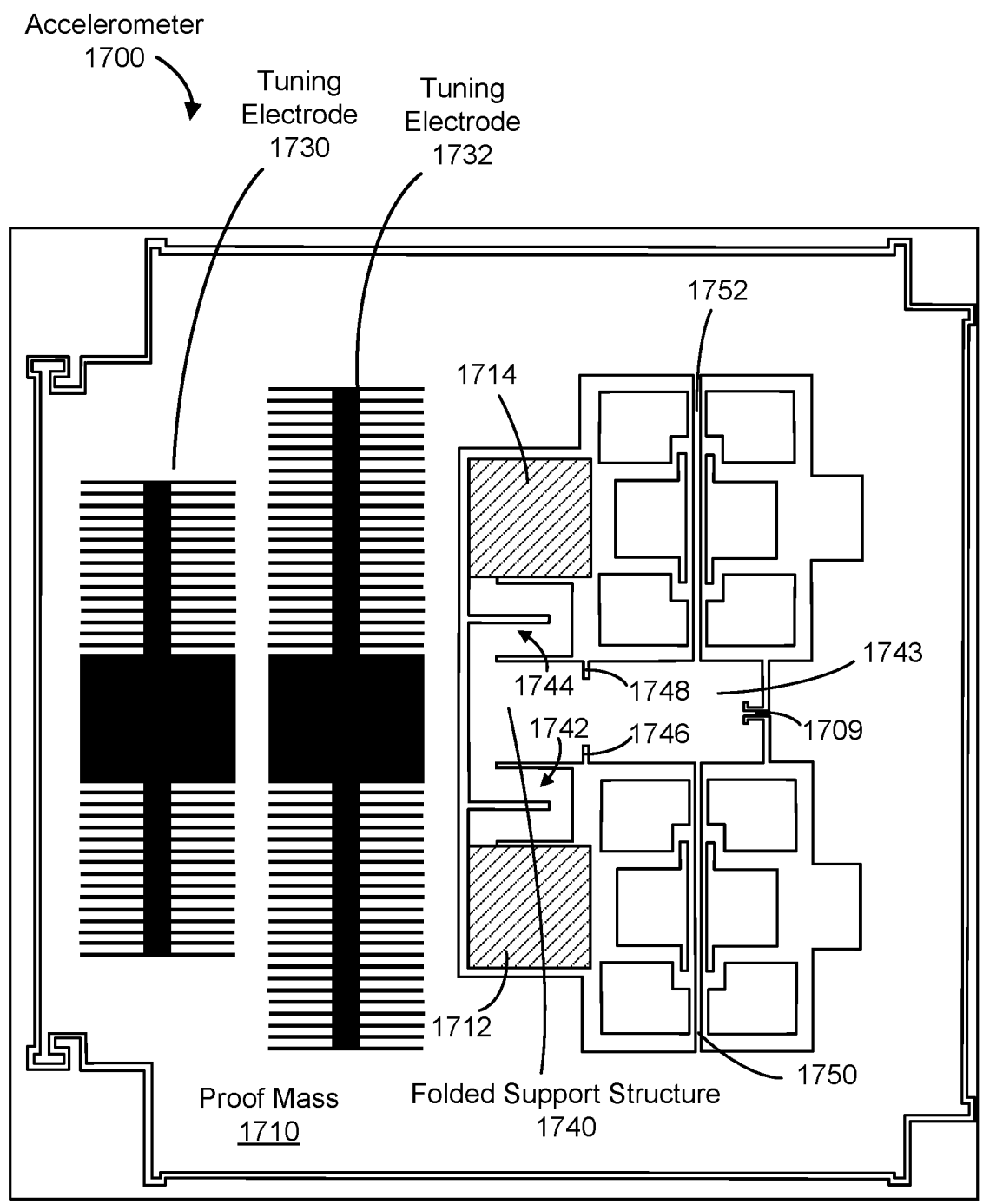
FIG. 17 illustrates an accelerometer incorporating a stress-isolating support structure, according to certain embodiments.

FIG. 17 illustrates a resonant accelerometer 1700 incorporating a stress-isolating support structure according to certain embodiments. The accelerometer 1700 is similar to the accelerometer 1600 in FIG. 16, but includes a pair of tuning electrodes 1730 and 1732 instead of a single tuning electrode. The additional tuning electrode provides for greater amplification of the potential difference between the tuning electrodes 1730, 1732 and proof mass 1710 at a given voltage (or the same level of amplification at a lower voltage) relative to the single tuning electrode.

The accelerometer 1700 further includes a support structure 1740 that couples the proof mass 1710 to a pair of anchors 1712 and 1714 located inside an opening within the area of the proof mass 1710. The support structure 1740 includes a beam 1743 that leads to a spring 1709. On either side of the beam 1743 are folded segments 1742 and 1744, which can be formed together with the beam 1743 as a monolithic unit. As shown in FIG. 17, the folded segments 1742, 1744 can be positioned orthogonal to the beam 1743, similar to the segments of the T-shaped support structure 1015 in FIG. 10. Each folded segment 1742, 1744 joins a respective anchor 1712, 1714 and includes one or more folds. The number of folds in each folded segment can vary, but the folded segment 1742 generally includes the same number of folds as the folded segment 1744 for balance. FIG. 17 is merely an example of one implementation of a folded support structure. In other embodiments, the shaped of a folded support structure may differ from that depicted in FIG. 17. Additionally, folded support structures can be applied to embodiments featuring a different number of anchors (e.g., a single anchor for the entire mechanical assembly).

The folded segments 1742, 1744 contribute to stress isolation. In particular, the folded segments 1742, 1744 are configured to deform in the presence of stress at the anchors 1712, 1714 caused by external forces (e.g., thermal and/or mechanical forces). The anchors 1712, 1714 are stationary, but the folded segments 1742, 1744 can bend or flex to attenuate stress that propagates through the anchors 1712, 1714. For example, stress may cause the folded segments 1742, 1744 to deflect in opposite directions along the x-axis (e.g., by 50 nanometers each for a total shift of 100 nanometers). Such deformation of the folded segments 1742, 1744 helps to absorb stress, reducing the total amount of stress that could potentially propagate to mechanical components responsible for sensing (e.g., the spring 1709 or sense beams 1750 and 1752).

The support structure 1740 can include one or more notches/cutouts 1746 and 1748 along the sides of the beam 1743. The notches 1746, 1748 are another feature that improves stress isolation. The notches 1746, 1748 operate as a "choke point" for stress or stress gradients, preventing stress and/or changes in stress from propagating much farther beyond the location of the notches 1746, 1748 (e.g., so that stress does not reach the sense beams 1750, 1752). Thus, a support structure incorporating a folded segment and/or a notch feature can provide better stress rejection, leading to improved overall sensor stability in the presence of varying environmental factors such as temperature and mechanical stress.

Although described in connection with an example resonant accelerometer design, the stress-isolating support structure shown in FIG. 17 can also be applied to other types of accelerometers that feature an anchor (e.g., quasi-static accelerometers).

Figure 18:
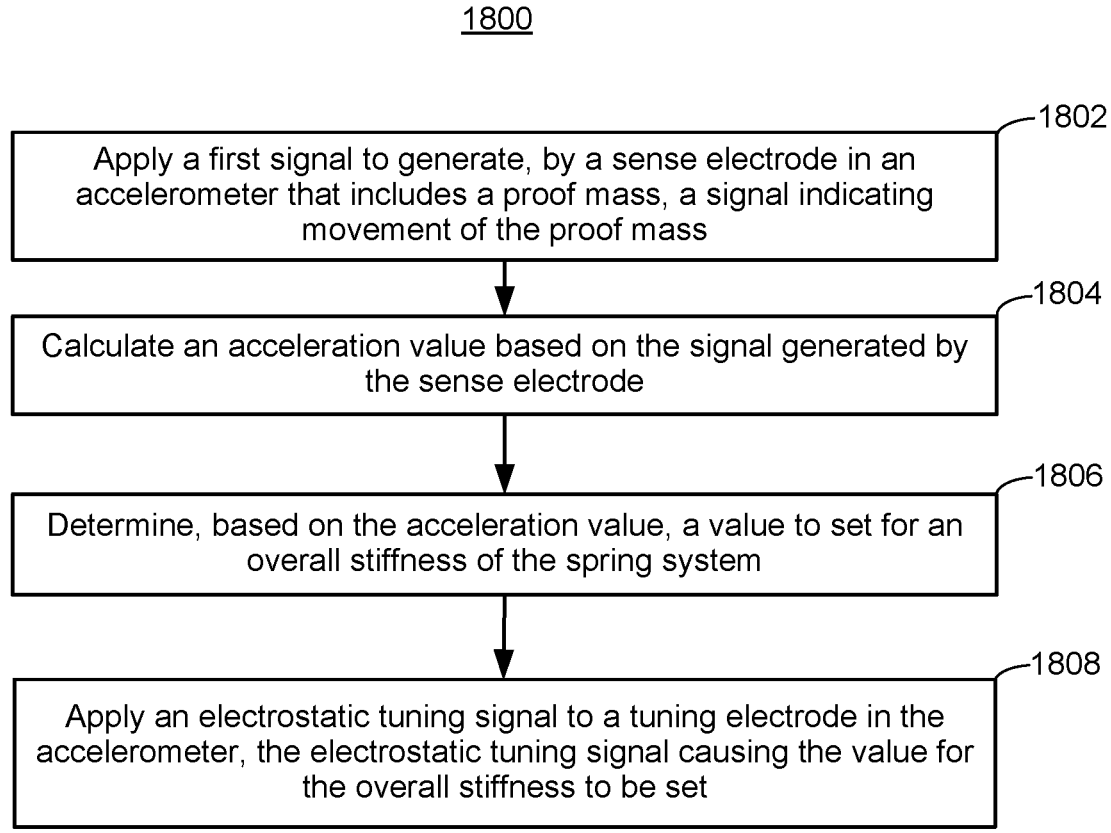
FIG. 18 is a flowchart of an example process for controlling the stiffness of a spring system in an accelerometer, according to certain embodiments.

FIG. 18 is a flowchart of an example process 1800 for controlling the stiffness of a spring system in an accelerometer, according to certain embodiments. In certain embodiments, the process 1800 is performed by an electronic controller that is part of or communicatively coupled to an accelerometer. In certain embodiments, the process 1800 is performed using software, for example, as computer-readable instructions stored on a non-transitory computer-readable medium, where the instructions are executable by one or more processors of a computer system.

At 1802, a first signal is applied to generate, by a sense electrode in an accelerometer that includes a proof mass, a signal indicating movement of the proof mass. For example, if the accelerometer is a resonant accelerometer, the first signal may be a signal applied to a drive electrode such that a sense beam is driven to oscillate at a particular resonance frequency according to the first signal. As another example, if the accelerometer is a quasi-static accelerometer, the first signal may be an amplitude modulated signal that is applied to the body of the proof mass to generate a voltage difference between the proof mass and the sense electrode, thereby enabling a capacitance measurement based on a voltage developed at the sense electrode.

At 1804, an acceleration value is calculated based on the signal generated by the sense electrode. The acceleration value can, for example, be based on a change in capacitance or a change in resonance frequency, as indicated by the signal generated by the sense electrode. The acceleration value may be calculated through a mathematical operation and/or a lookup to stored data (e.g., a table mapping the frequency of a single sense beam or the frequency difference between two sense beams to an acceleration value). In certain embodiments, the acceleration value is calculated as an average acceleration over a certain period of time (e.g., ten seconds).

At 1806, a value to set for the overall stiffness of the spring system of the accelerometer is determined based on the acceleration value that was calculated in 1804. As discussed earlier, the stiffness of the spring system can adjusted up or down (e.g., to a particular value for the overall stiffness) based on the amount of acceleration (e.g., an absolute value or magnitude) and/or the change in acceleration (e.g., the difference between the acceleration value calculated in 1804 and a previously calculated acceleration value).

At 1808 an electrostatic tuning signal is applied to a tuning electrode in the accelerometer. The electrostatic tuning signal causes the value for the overall stiffness to be set, and is separate from the first signal. For example, the electrostatic tuning signal may be configured to generate a certain voltage difference between the proof mass and the tuning electrode. Further, in some embodiments, multiple tuning signals are applied. For example, a desired voltage difference between the proof mass and a single tuning electrode may be established by applying tuning signals to both the proof mass and the tuning electrode. As another example, in embodiments featuring multiple tuning electrodes, a separate tuning signal may be applied to each tuning electrode individually.

Blocks 1802-1808 can be repeated to further adjust the overall stiffness of the spring system based on a new acceleration measurement.

Figure 19:
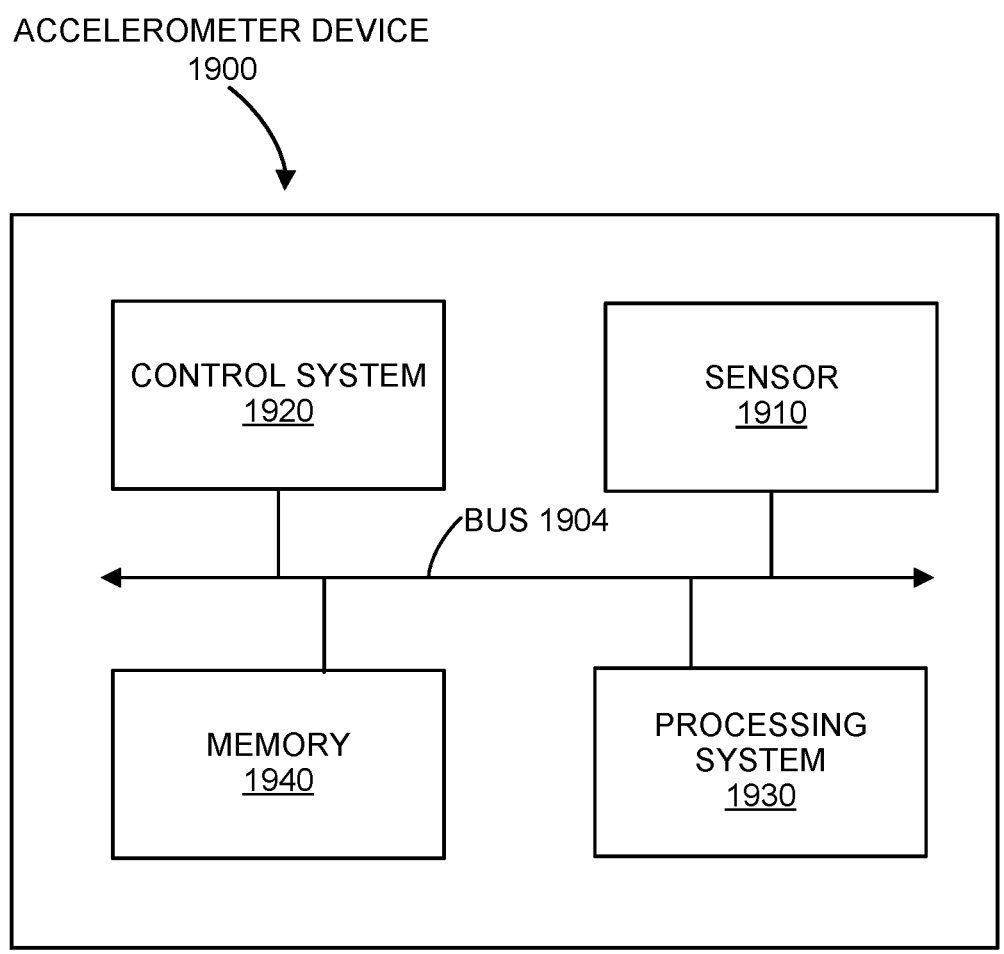
FIG. 19 is a simplified block diagram of an accelerometer device incorporating one or embodiments.

FIG. 19 is a simplified block diagram of an accelerometer device 1900 incorporating one or embodiments. The accelerometer device 1900 includes a sensor 1910, a control system 1920, a processing system 1930, and a memory 1940. Although shown within a single device, the blocks in FIG. 19 can be implemented on more than one device. For example, in some embodiments, the processing system 1930 may be a computer system coupled to an accelerometer device that includes the sensor 1910.

Sensor 1910 can include one or more accelerometers configured according to an embodiment described herein. For example, sensor 1910 can be an IMU with multiple accelerometers, each accelerometer configured for detecting acceleration along a single axis. Alternatively, sensor 1910 may include an accelerometer configured for detecting acceleration along multiple axes (e.g., a resonant accelerometer with sense beams arranged orthogonally to each other). Sensor 1910 can include accelerometers of the same type or a mix of different types of accelerometers (e.g., a quasi-static accelerometer in combination with a resonant accelerometer). In some embodiments, the sensor 1910 is implemented as an integrated circuit (IC) chip including a plastic body that houses the one or more accelerometers. Accelerometer device 1900 may include a circuit board onto which the sensor 1910 is mounted (e.g., soldered or placed into a socket).

Control system 1920 is configured to direct the sensing operations of the sensor 1910. For example, the control system 1920 can generate a signal applied to a sense electrode, a proof mass, or a drive electrode of an accelerometer in the sensor 1910. Additionally, in embodiments featuring electrostatic spring softening, the control system 1920 may be configured to generate an electrostatic tuning signal applied to a tuning electrode of an accelerometer in the sensor 1910.

Signals communicated between the control system 1920 and the sensor 1910 may travel via a bus 1904 that interconnects the various blocks shown in FIG. 19. The bus 1904 may be configured to permit bi-directional communication between one block and another block. For example, the sensor 1910 may be configured to output one or more sensed signals generated by one or more sense electrodes in response acceleration-induced movement of a proof mass, and the sensed signals may be communicated to the control system 1920 and/or the processing system 1930 (e.g., for processing to determine whether to adjust the extent of any electrostatic spring softening).

Processing system 1930 is configured to compute acceleration values (e.g., acceleration along one or more axes). The processing system 1930 can compute each acceleration value based on at least one sensed signal generated by a sense electrode (e.g., a sense electrode in a single-ended configuration as in FIG. 8A or a pair of sense electrodes in a differential configuration as in FIG. 8B). Processing system 1930 may perform additional signal processing using the sensed signals prior to or after computing an acceleration value. For example, processing system 1930 may perform noise filtering, time averaging, statistical analysis, and the like.

The control system 1920 and the processing system 1930 can each be implemented using software, hardware, or a combination of software and hardware. For example, the functionality described above with respect to the control system 1920 and the processing system 1930 can be provided through program code executed by one or more processors of a computer. In certain embodiments, the control system 1920 and the processing system 1930 may be combined into a single system (e.g., a microcontroller). Further, in some embodiments, the entire accelerometer device 1900 may be implemented as a system-on-chip.

Memory 1940 is configured to store instructions and/or data used in connection with the sensing operations of the sensor 1910. For example, memory 1940 may store program code executed by the control system 1920 and/or the processing system 1930. Memory 1940 may also store one or more data structures (e.g., a mapping table for computing acceleration based on a difference between resonance frequencies, a mapping table that associates an acceleration value or change in acceleration to an amount of spring-softening, a file log of computed acceleration values, and the like).

Embodiments of the invention may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

Figure 20:
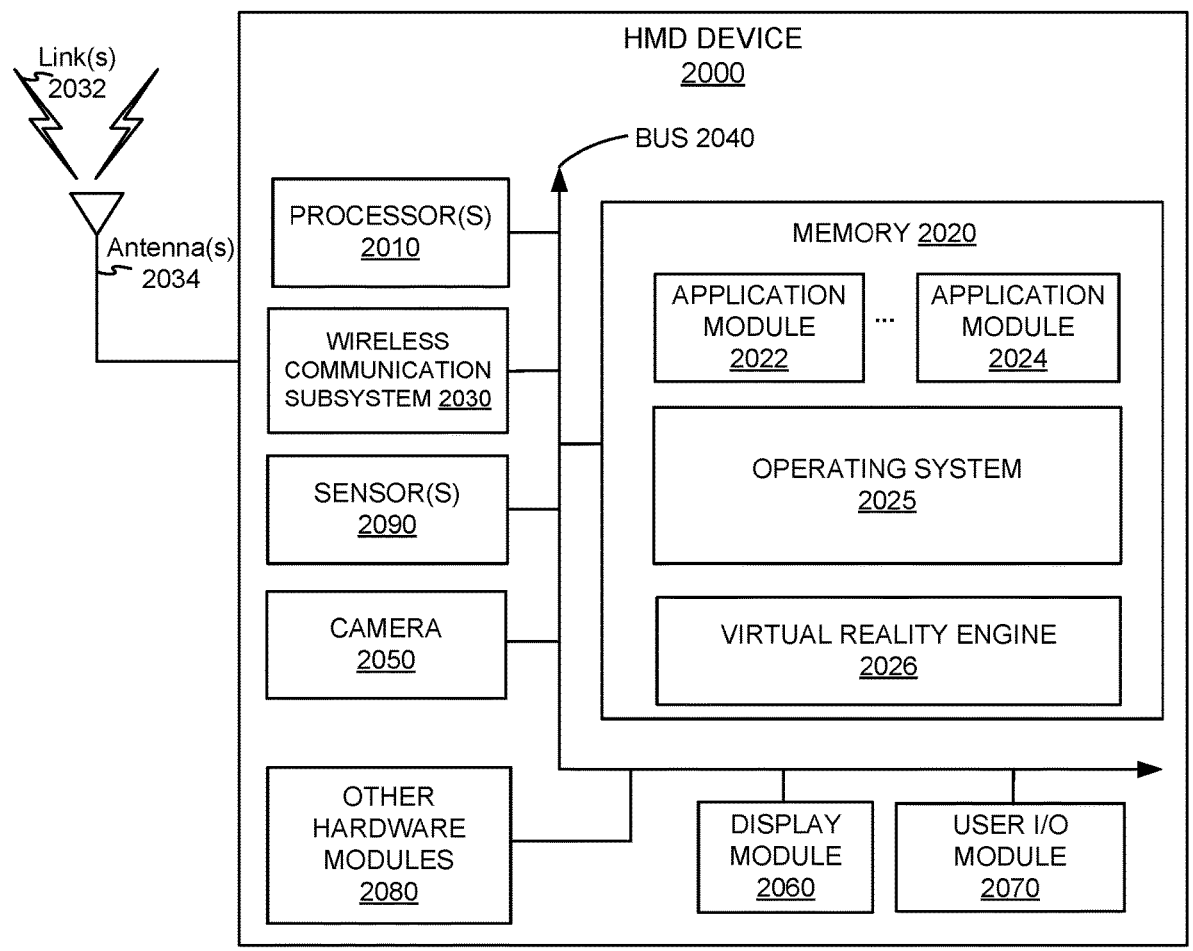
FIG. 20 is a simplified block diagram of a head-mount display device incorporating one or more embodiments.

FIG. 20 is a simplified block diagram of an example HMD device 2000 for implementing one or more embodiments disclosed herein. HMD device 2000 may include components similar to those described above with respect to the accelerometer device 1900 of FIG. 19. In this example, HMD device 2000 may include one or more processor(s) 2010 and a memory 2020. Processor(s) 2010 may be configured to execute instructions for performing operations at a number of components, and can be, for example, a general-purpose processor or microprocessor suitable for implementation within a portable electronic device. Processor(s) 2010 may be communicatively coupled with a plurality of components within HMD device 2000. To realize this communicative coupling, processor(s) 2010 may communicate with the other illustrated components across a bus 2040. Bus 2040 may be any subsystem adapted to transfer data within HMD device 2000. Bus 2040 may include a plurality of computer buses and additional circuitry to transfer data.

Memory 2020 may be coupled to processor(s) 2010. In some embodiments, memory 2020 may offer both short-term and long-term storage and may be divided into several units. Memory 2020 may be volatile, such as static random access memory (SRAM) and/or dynamic random access memory (DRAM) and/or non-volatile, such as read-only memory (ROM), flash memory, and the like. Furthermore, memory 2020 may include removable storage devices, such as secure digital (SD) cards. Memory 2020 may provide storage of computer-readable instructions, data structures, program modules, and other data for HMD device 2000. In some embodiments, memory 2020 may be distributed into different hardware modules. A set of instructions and/or code might be stored on memory 2020. The instructions might take the form of executable code that may be executable by HMD device 2000, and/or might take the form of source and/or installable code, which, upon compilation and/or installation on HMD device 2000 (e.g., using any of a variety of generally available compilers, installation programs, compression/decompression utilities, etc.), may take the form of executable code.

In some embodiments, memory 2020 may store a plurality of application modules 2022 through 2024, which may include any number of applications. Examples of applications may include gaming applications, conferencing applications, video playback applications, or other suitable applications. The applications may include a depth sensing function. Application modules 2022-2024 may include particular instructions to be executed by processor(s) 2010. In some embodiments, certain applications or parts of application modules 2022-2024 may be executable by other hardware modules 2080. In certain embodiments, memory 2020 may additionally include secure memory, which may include additional security controls to prevent copying or other unauthorized access to secure information.

In some embodiments, memory 2020 may include an operating system 2025 loaded therein. Operating system 2025 may be operable to initiate the execution of the instructions provided by application modules 2022-2024 and/or manage other hardware modules 2080 as well as interfaces with a wireless communication subsystem 2030 which may include one or more wireless transceivers. Operating system 2025 may be adapted to perform other operations across the components of HMD device 2000 including threading, resource management, data storage control and other similar functionality.

Wireless communication subsystem 2030 may include, for example, an infrared communication device, a wireless communication device and/or chipset (such as a Bluetooth® device, an IEEE 802.11 device, a Wi-Fi device, a WiMax device, cellular communication facilities, etc.), and/or similar communication interfaces. HMD device 2000 may include one or more antennas 2034 for wireless communication as part of wireless communication subsystem 2030 or as a separate component coupled to any portion of the system. Depending on desired functionality, wireless communication subsystem 2030 may include separate transceivers to communicate with base transceiver stations and other wireless devices and access points, which may include communicating with different data networks and/or network types, such as wireless wide-area networks (WWANs), wireless local area networks (WLANs), or wireless personal area networks (WPANs). A WWAN may be, for example, a WiMax (IEEE 802.16) network. A WLAN may be, for example, an IEEE 802.11x network. A WPAN may be, for example, a Bluetooth network, an IEEE 802.15x, or some other types of network. The techniques described herein may also be used for any combination of WWAN, WLAN, and/or WPAN. Wireless communications subsystem 2030 may permit data to be exchanged with a network, other computer systems, and/or any other devices described herein. Wireless communication subsystem 2030 may include a means for transmitting or receiving data, such as identifiers of HMD devices, position data, a geographic map, a heat map, photos, or videos, using antenna(s) 2034 and wireless link(s) 2032.

Embodiments of HMD device 2000 may also include one or more sensors 2090. Sensor(s) 2090 may include, for example, an accelerometer (e.g., an accelerator according to one of the embodiments described above), a pressure sensor, a temperature sensor, a proximity sensor, a magnetometer, a gyroscope, an inertial sensor (e.g., a module that combines an accelerometer and a gyroscope), an ambient light sensor, or any other similar module operable to provide sensory output and/or receive sensory input, such as a depth sensor or a position sensor. For example, in some implementations, sensor(s) 2090 may include one or more inertial measurement units (IMUs) and/or one or more position sensors. An IMU may generate calibration data indicating an estimated position of HMD device 2000 relative to an initial position of HMD device 2000, based on measurement signals received from one or more of the position sensors. A position sensor may generate one or more measurement signals in response to motion of HMD device 2000. Examples of the position sensors may include, but are not limited to, one or more accelerometers, one or more gyroscopes, one or more magnetometers, another suitable type of sensor that detects motion, a type of sensor used for error correction of the IMU, or some combination thereof. The position sensors may be located external to the IMU, internal to the IMU, or some combination thereof. At least one sensor 2090 may use a structured light pattern for sensing.

HMD device 2000 may include a display module 2060. Display module 2060 may be a near-eye display, and may graphically present information, such as images, videos, and various instructions, from HMD device 2000 to a user. Such information may be derived from one or more application modules 2022-2024, virtual reality engine 2026, one or more other hardware modules 2080, a combination thereof, or any other suitable means for resolving graphical content for the user (e.g., by operating system 2025). Display module 2060 may use liquid crystal display (LCD) technology, light-emitting diode (LED) technology (including, for example, OLED, ILED, mLED, AMOLED, TOLED, etc.), light emitting polymer display (LPD) technology, or some other display technology.

HMD device 2000 may include a user input/output module 2070. User input/output module 2070 may allow a user to send action requests to HMD device 2000. An action request may be a request to perform a particular action. For example, an action request may be to start or end an application or to perform a particular action within the application. User input/output module 2070 may include one or more input devices. Example input devices may include a touchscreen, a touch pad, microphone(s), button(s), dial(s), switch(es), a keyboard, a mouse, a game controller, or any other suitable device for receiving action requests and communicating the received action requests to HMD device 2000. In some embodiments, user input/output module 2070 may provide haptic feedback to the user in accordance with instructions received from HMD device 2000. For example, the haptic feedback may be provided when an action request is received or has been performed.

HMD device 2000 may include a camera 2050 that may be used to take photos or videos of a user, for example, for tracking the user's eye position. Camera 2050 may also be used to take photos or videos of the environment, for example, for VR, AR, or MR applications. Camera 2050 may include, for example, a complementary metal—oxide—semiconductor (CMOS) image sensor with a few millions or tens of millions of pixels. In some implementations, camera 2050 may include two or more cameras that may be used to capture 3-D images.

In some embodiments, HMD device 2000 may include a plurality of other hardware modules 2080. Each of other hardware modules 2080 may be a physical module within HMD device 2000. While each of other hardware modules 2080 may be permanently configured as a structure, some of other hardware modules 2080 may be temporarily configured to perform specific functions or temporarily activated. Examples of other hardware modules 2080 may include, for example, an audio output and/or input module (e.g., a microphone or speaker), a near field communication (NFC) module, a rechargeable battery, a battery management system, a wired/wireless battery charging system, etc. In some embodiments, one or more functions of other hardware modules 2080 may be implemented in software.

In some embodiments, memory 2020 of HMD device 2000 may also store a virtual reality engine 2026. Virtual reality engine 2026 may execute applications within HMD device 2000 and receive position information, acceleration information, velocity information, predicted future positions, or some combination thereof of HMD device 2000 from the various sensors. In some embodiments, the information received by virtual reality engine 2026 may be used for producing a signal (e.g., display instructions) to display module 2060. For example, if the received information indicates that the user has looked to the left, virtual reality engine 2026 may generate content for HMD device 2000 that mirrors the user's movement in a virtual environment. Additionally, virtual reality engine 2026 may perform an action within an application in response to an action request received from user input/output module 2070 and provide feedback to the user. The provided feedback may be visual, audible, or haptic feedback. In some implementations, processor(s) 2010 may include one or more GPUs that may execute virtual reality engine 2026.

In various implementations, the above-described hardware and modules may be implemented on a single device or on multiple devices that can communicate with one another using wired or wireless connections. For example, in some implementations, some components or modules, such as GPUs, virtual reality engine 2026, and applications (e.g., tracking application), may be implemented on a console separate from the head-mounted display device. In some implementations, one console may be connected to or support more than one HMD.

In alternative configurations, different and/or additional components may be included in HMD device 2000. Similarly, functionality of one or more of the components can be distributed among the components in a manner different from the manner described above. For example, in some embodiments, HMD device 2000 may be modified to include other system environments, such as an AR system environment and/or an MR environment.

The methods and apparatuses discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, systems, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing various embodiments. Various changes may be made in the function and arrangement of elements without departing from the spirit and scope of the present disclosure.

Also, some embodiments were described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

It will be apparent to those skilled in the art that substantial variations may be made in accordance with specific requirements. For example, customized or special-purpose hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium," as used herein, refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media such as compact disk (CD) or digital versatile disk (DVD), punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code. A computer program product may include code and/or machine-executable instructions that may represent a procedure, a function, a subprogram, a program, a routine, an application (App), a subroutine, a module, a software package, a class, or any combination of instructions, data structures, or program statements.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms, "and" and "or" as used herein, may include a variety of meanings that are also expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, AB, AC, BC, AA, ABC, AAB, AABBCCC, etc.

Certain embodiments may be implemented only in hardware, or only in software, or using combinations thereof. In one example, software may be implemented with a computer program product containing computer program code or instructions executable by one or more processors for performing any or all of the steps, operations, or processes described in this disclosure, where the computer program may be stored on a non-transitory computer readable medium. The various processes described herein can be implemented on the same processor or different processors in any combination.

Where devices, systems, components or modules are described as being configured to perform certain operations or functions, such configuration can be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes can communicate using a variety of techniques, including, but not limited to, conventional techniques for inter-process communications, and different pairs of processes may use different techniques, or the same pair of processes may use different techniques at different times.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

What is claimed is:

1. A microelectromechanical systems (MEMS) device comprising:
   a proof mass;
   a first anchor located in an opening, the opening defined by a body of the proof mass;
   a spring between the proof mass and the first anchor, wherein the spring and the proof mass form a spring system suspended from the first anchor;
   a first drive electrode;
   a first sense beam with a first end attached to the proof mass, the first sense beam configured to oscillate at a particular resonance frequency based on application of a signal to the first drive electrode; and
   a support structure located in the opening, wherein:
     the support structure is coupled to the first anchor and includes a support beam,
     the spring corresponds to an end of the support beam that has a reduced thickness,
     the first sense beam includes a second end attached to the support beam such that the first sense beam is orthogonal to the support beam, and
     the support structure operates as a stress decoupling area that prevents or limits propagation of stress from the first anchor to the first sense beam and the spring system.

2. The MEMS device of claim 1, wherein the support beam, the spring, and the proof mass are integrally formed from a same material.

3. The MEMS device of claim 1, further comprising:
   a second anchor located in the opening, wherein the support structure includes a section extending from the first anchor to the second anchor and orthogonally to the support beam.

4. The MEMS device of claim 3, wherein the section extending from the first anchor to the second anchor comprises a first folded segment between the support beam and the first anchor and a second folded segment between the support beam and the second anchor.

5. The MEMS device of claim 4, wherein the first folded segment and the second folded segment each include one or more folds, and wherein a number of folds in the first folded segment is the same as a number of folds in the second folded segment.

6. The MEMS device of claim 3, wherein the section extending from the first anchor to the second anchor forms a T shape with the support beam.

7. The MEMS device of claim 3, wherein the support beam comprises:
   a first notch located along a side of the support beam facing the first anchor; and
   a second notch opposite the first notch, the second notch being located along a side of the support beam facing the second anchor.

8. The MEMS device of claim 1, further comprising:
   a second sense beam attached between the proof mass and the support beam, wherein the second sense beam is collinear with the first sense beam.

9. The MEMS device of claim 1, further comprising:
   a tuning electrode located in a second opening defined by the body of the proof mass, wherein the tuning electrode is configured to receive an electrostatic tuning signal providing a negative contribution to an overall stiffness of the spring system.

10. The MEMS device of claim 1, wherein the proof mass includes a first L-shaped portion configured to constrain movement of the proof mass as a result of the first L-shaped portion coming into contact with a first L-shaped bump stop.

11. The MEMS device of claim 10, wherein the proof mass includes a second L-shaped portion configured to constrain movement of the proof mass as a result of the second L-shaped portion coming into contact with a second L-shaped bump stop, and wherein the first L-shaped portion and the second L-shaped portion are located on opposite ends of one side of the proof mass.

12. A system comprising:
   a proof mass;
   a first anchor located in an opening, the opening defined by a body of the proof mass;
   a spring between the proof mass and the first anchor, wherein the spring and the proof mass form a spring system suspended from the first anchor;
   a first drive electrode;
   a first sense beam with a first end attached to the proof mass, the first sense beam configured to oscillate at a particular resonance frequency based on application of a signal to the first drive electrode;
   a support structure located in the opening, wherein:
     the support structure is coupled to the first anchor and includes a support beam,
     the spring corresponds to an end of the support beam that has a reduced thickness,
     the first sense beam includes a second end attached to the support beam such that the first sense beam is orthogonal to the support beam, and
     the support structure operates as a stress decoupling area that prevents or limits propagation of stress from the first anchor to the first sense beam and the spring system; and
   one or more processors configured to:
     generate the signal applied to the first drive electrode; and
     calculate an acceleration value based on a signal indicating a change in the resonance frequency of the first sense beam.

13. The system of claim 12, wherein the support beam, the spring, and the proof mass are integrally formed from a same material.

14. The system of claim 12, further comprising:
a second anchor located in the opening, wherein the support structure includes a section extending from the first anchor to the second anchor and orthogonally to the support beam.

15. The system of claim 14, wherein the section extending from the first anchor to the second anchor comprises a first folded segment between the support beam and the first anchor and a second folded segment between the support beam and the second anchor.

16. The system of claim 15, wherein the first folded segment and the second folded segment each include one or more folds, and wherein a number of folds in the first folded segment is the same as a number of folds in the second folded segment.

17. The system of claim 14, wherein the section extending from the first anchor to the second anchor forms a T shape with the support beam.

18. The system of claim 14, wherein the support beam comprises:
a first notch located along a side of the support beam facing the first anchor; and
a second notch opposite the first notch, the second notch being located along a side of the support beam facing the second anchor.

19. The system of claim 12, further comprising:
a tuning electrode located in a second opening defined by the body of the proof mass, wherein the tuning electrode is configured to receive an electrostatic tuning signal providing a negative contribution to an overall stiffness of the spring system, and wherein the one or more processors are configured to generate the electrostatic tuning signal based on the calculated acceleration value.

20. The system of claim 12, wherein the proof mass includes an L-shaped portion configured to constrain movement of the proof mass as a result of the L-shaped portion coming into contact with an L-shaped bump stop.

* * * * *